(12) United States Patent
Jin et al.

(10) Patent No.: US 12,300,344 B2
(45) Date of Patent: May 13, 2025

(54) MEMORY DEVICE, MEMORY DEVICE TEST METHOD, AND TEST SYSTEM

(71) Applicant: Samsung Electronics Co., Ltd., Suwon-si (KR)

(72) Inventors: Hong-Jun Jin, Suwon-si (KR); Wonyoung Choi, Suwon-si (KR); Chungman Kim, Suwon-si (KR); Youngseok Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/467,959

(22) Filed: Sep. 15, 2023

(65) Prior Publication Data
US 2024/0220117 A1 Jul. 4, 2024

(30) Foreign Application Priority Data
Dec. 28, 2022 (KR) .................. 10-2022-0187354

(51) Int. Cl.
*G11C 29/56* (2006.01)
*G11C 29/12* (2006.01)

(52) U.S. Cl.
CPC .. *G11C 29/56004* (2013.01); *G11C 29/12015* (2013.01)

(58) Field of Classification Search
CPC .................. G11C 29/56004; G11C 29/12015
See application file for complete search history.

(56) References Cited

U.S. PATENT DOCUMENTS

| | | | |
|---|---|---|---|
| 6,266,799 B1* | 7/2001 | Lee ..................... | H03L 7/0991 716/113 |
| 8,552,891 B2 | 10/2013 | Bae et al. | |
| 10,554,455 B2 | 2/2020 | Schnizler | |
| 10,978,116 B2 | 4/2021 | Hasbun et al. | |
| 11,581,960 B2 | 2/2023 | Jin et al. | |
| 2013/0083611 A1* | 4/2013 | Ware ..................... | G06F 3/0625 365/191 |
| 2013/0159761 A1* | 6/2013 | Baumgartner ........... | H04L 1/22 710/316 |
| 2022/0178997 A1 | 6/2022 | Jang et al. | |
| 2022/0190936 A1 | 6/2022 | Jin et al. | |

FOREIGN PATENT DOCUMENTS

| CN | 110784266 A | 2/2020 |
|---|---|---|
| KR | 20030049481 A | 6/2003 |
| KR | 20220085618 A | 6/2022 |

\* cited by examiner

*Primary Examiner* — Joseph D Torres
(74) *Attorney, Agent, or Firm* — Myers Bigel, P.A.

(57) ABSTRACT

A memory device according to an embodiment includes a memory cell array; a timing circuit configured to generate a first clock signal and a second clock signal, the second clock signal having a frequency that is i-times the frequency of the first clock signal; a command decoder configured to receive On-The-Fly (OTF) data including a plurality of OTF bits; a receiver configured to receive input data, sample the input data based on the first clock signal, and generate a first signal based on the sampled input data; a deserializer configured to generate a first deserialized signal from the first signal based on the second clock signal; a data pattern generator configured to generate a pattern signal based on the first deserialized signal and the OTF data based on the second clock signal; and a decoder configured to transmit the pattern signal to the memory cell array.

20 Claims, 12 Drawing Sheets

MEMORY DEVICE, MEMORY DEVICE TEST METHOD, AND TEST SYSTEM

CROSS-REFERENCE TO RELATED APPLICATION

This application claims priority to and the benefit of Korean Patent Application No. 10-2022-0187354 filed on Dec. 28, 2022 in the Korean Intellectual Property Office, the entire contents of which are incorporated herein by reference.

BACKGROUND

(a) Field

The present disclosure relates to a memory device, a method for testing a memory device, and a test system including a memory device.

(b) Description of the Related Art

As capacity of the data transmitted and received among electronic devices increases and demands for high data rates increase, various signal modulation methods may be used to increase data throughput. The pulse amplitude modulation (PAM)-N method, which is one of various signal modulation methods, may transmit one symbol for a unit section. For example, one bit may be transmitted for a unit section according to the PAM-2 method referred to as the non return to zero (NRZ) method, and two bits may be transmitted for a unit section according to the PAM-3 method A semiconductor device test device tests whether a manufactured semiconductor device has defects. The semiconductor memory device is tested by writing a test pattern to memory cells of the semiconductor memory device according to a write operation by using external test equipment, reading the memory cells, comparing the read data and the written data to determine whether the read data and the written data are identical to each other, and thereby determining whether the semiconductor memory device is good or bad. The semiconductor device test device may be used to test a memory device so it is designed and developed in consideration of states of developing memory devices, particularly DRAMs, which occupy a majority portion of the memory device market. However, compared to the high-speed production of the semiconductor memory devices, the test devices may not be able to keep pace with the high-speed production of the semiconductor memory devices because of issues, such as economics.

SUMMARY

An embodiment provides a memory device including a data input and output circuit for testing a memory device by using a device having different signal types.

An embodiment of the present disclosure provides a memory device including: a memory cell array; a timing circuit configured to generate a first clock signal and a second clock signal, the second clock signal having a frequency that is i-times the frequency of the first clock signal; a command decoder configured to receive On-The-Fly (OTF) data including a plurality of OTF bits; a receiver configured to receive input data, configured to sample the input data based on the first clock signal, and configured to generate a first signal based on the sampled input data; a deserializer configured to generate a first deserialized signal from the first signal based on the second clock signal; a data pattern generator configured to generate a pattern signal based on the first deserialized signal and the OTF data based on the second clock signal; and a decoder configured to transmit the pattern signal to the memory cell array, wherein i is a natural number greater than or equal to 2.

The first signal may have n-bit data, and the first deserialized signal may have 2n-bit data.

The deserializer may comprise a plurality of samplers configured to parallelize n-bit data of the first signal and configured to generate the first deserialized signal.

The data pattern generator may comprise a combination logic configured to generate an inverted data signal with 2n-bit data based on the OTF data, and a plurality of XOR gates configured to perform an XOR operation on respective bits of the inverted data signal and respective bits of the first deserialized signal and configured to generate the pattern signal having 2n-bit data.

Each of the plurality of OTF bits may be sequentially arranged in the inverted data signal.

The receiver may be further configured to sample the input data based on the first clock signal to generate a second signal with n-bit data, the deserializer may be further configured to insert new bits among n-bit data of the second signal based on the second clock signal to generate a second deserialized signal, the data pattern generator may be further configured to generate the pattern signal based on the second deserialized signal based on the second clock signal, at least some of the plurality of XOR gates may be configured to perform an XOR operation on respective bits of the inverted data signal and respective bits of the second deserialized signal, and the inverted data signal may comprise a first inverted data signal on which an XOR operation is performed with the first deserialized signal and a second inverted data signal on which an XOR operation is performed with the second deserialized signal.

The first inverted data signal may be equivalent to the second inverted data signal.

The first inverted data signal may be different from the second inverted data signal.

The memory device may further comprise a data input and output controller configured to generate a first control signal for controlling the deserializer and configured to generate a second control signal for controlling a data pattern generator, wherein the deserializer may be configured to parallelize the first signal according to the first control signal to generate the deserialized signal, and the data pattern generator may be further configured to determine OTF bits that correspond to respective bits in the deserialized signal from among the plurality of OTF bits according to the second control signal, may generate new bits based on the corresponding OTF bits, and may arrange the deserialized signal and the new bits to generate the pattern signal.

The data input and output controller may be further configured to generate a third control signal for controlling the decoder, the decoder may comprise a decoding portion for generating a decoding signal by decoding the pattern signal and a delay portion for generating a first delay signal by delaying the pattern signal, and the decoder may be configured to transmit the decoding signal or the first delay signal to the memory cell array according to the third control signal.

The memory device may further comprise an encoder including an encoding portion configured to generate an encoding signal by encoding output data output by the memory cell array and a delay portion configured to generate a second delay signal by delaying the output data, wherein the data input and output controller may be further configured to generate a fourth control signal for controlling the encoder, and the encoder may be configured to output the encoding signal or the second delay signal as a data signal according to the fourth control signal.

The memory device may further comprise a serializer configured to generate a first serialized signal based on the data signal, wherein the first serialized signal may have n-bit data.

The serializer may be further configured to select n bits from among the output data based on the plurality of OTF bits, and may be configured to generate the first serialized signal based on the selected n bits.

The first signal may have n-bit data, and the first deserialized signal may have 4n-bit data.

The command decoder may be further configured to receive the OTF data through one of an ERR terminal, a command terminal, and an address terminal.

Another embodiment of the present disclosure provides a test method including: receiving input data and On-The-Fly (OTF) data comprising a plurality of OTF bits; sampling the input data based on first clock signal to generate a first signal based on the sampled input data; generating a first deserialized signal from the first signal based on a second clock signal having a frequency that is i-times the frequency of the first clock signal; generating a pattern signal based on the first deserialized signal and the OTF data based on the second clock signal, and storing the pattern signal in a memory cell array; and sequentially arranging respective bits in output data output by the memory cell array and generating a first serialized signal based on the output data, wherein i is a natural number greater than or equal to 2.

The test method may further comprise comparing the input data and the first serialized signal and determining whether the memory device operated normally.

Another embodiment of the present disclosure provides a test system including a memory device and a test device for testing the memory device, wherein the test device is configured to transmit a write command, On-The-Fly (OTF) data comprising a plurality of OTF bits, and input data to the memory device, is configured to transmit a read command and the OTF data to the memory device, is configured to receive output data from the memory device, and is configured to compare the input data and the output data, and the memory device is configured to receive the write command, is configured to sample the input data based on a first clock signal to generate a first signal, is configured to generate a first deserialized signal from the first signal based on a second clock signal having a frequency that is i-times the frequency of the first clock signal, is configured to generate a pattern signal based on the first deserialized signal and the OTF data based on the second clock signal, is configured to store the pattern signal in a memory cell array, is configured to receive the read command, is configured to select some bits of the pattern signal based on the OTF data, is configured to arrange the some bits, and is configured to output the output data including the some bits, wherein i is a natural number greater than or equal to 2.

The first signal may have n-bit data, and the first deserialized signal may have 2n-bit data.

The first signal may have n-bit data, and the first deserialized signal may have 4n-bit data.

The first signal may have n-bit data, and the first deserialized signal may have 2n-bit data, and the memory device may be configured to generate an inverted data signal having the 2n-bit data based on the OTF data, and may be config- ured to perform an XOR operation on respective bits of the inverted data signal and respective bits of the first deserialized signal to generate the pattern signal.

DETAILED DESCRIPTION OF THE EMBODIMENTS

Figure 1:
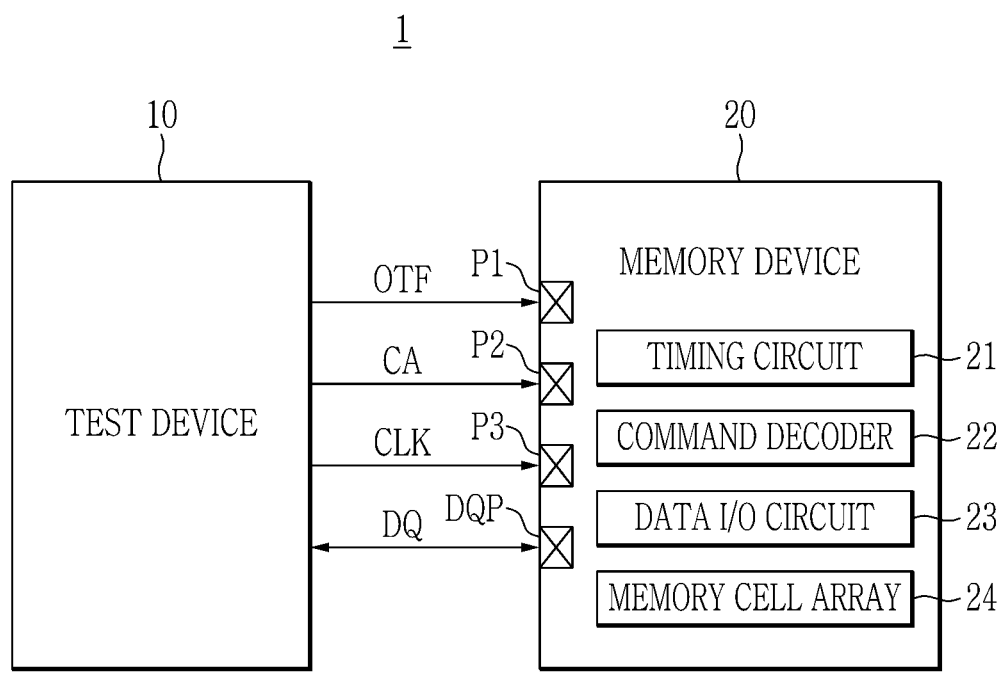
FIG. 1 illustrates a test system according to an embodiment.

In the following detailed description, only certain embodiments of the present disclosure have been shown and described, simply by way of illustration. As those skilled in the art would realize, the described embodiments may be modified in various different ways, all without departing from the spirit or scope of the present disclosure.

Accordingly, the drawings and description are to be regarded as illustrative in nature and not restrictive, and like reference numerals designate like elements throughout the specification. In the flowcharts described with reference to the drawings in this specification, the operation order may be changed, various operations may be merged, certain operations may be divided, and certain operations may not be performed. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination. The following will now describe a semiconductor package and its fabrication method according to the present inventive concepts.

An expression recited in the singular may be construed as singular or plural unless the expression "one", "single", etc., is used. Terms including ordinal numbers such as first, second, and the like, will be used only to describe various components, and are not to be interpreted as limiting these components. The terms may only be used to differentiate one component from others.

FIG. 1 illustrates a test system including a test device and a memory device according to an embodiment.

Referring to FIG. 1, the test system 1 may include a test device 10 and a memory device 20.

The test device 10 may provide signals to the memory device 20 to determine whether the memory device 20 is operating normally.

In detail, the test device 10 may be configured to write data to the memory device 20 and may read the data written to the memory device 20. The test device 10 may compare the data written to the memory device 20 and the data read from the memory device 20 and may determine whether the memory device 20 is operating normally.

The test device 10 may be automatic test equipment (ATE). The test device 10 may be, for example, an oscilloscope, a frequency counter, or other devices for analyzing responses of the memory device 20.

The test device 10 may be configured to transmit an On The Fly (OTF) signal OTF, a command and address CA signal, and a clock CLK signal to the memory device 20, and may be configured to transmit/receive a data signal DQ to/from the memory device 20.

The OTF signal OTF may be input to the memory device 20 through a first terminal P1. The first terminal P1 may be an ERR terminal for outputting data for indicating that an error is generated when the error is generated in the memory device 20. The test device 10 may be configured to input the OTF signal OTF used for generating test data needed for performing a test operation of the memory device 20 to the memory device 20 through the first terminal P1. The first terminal P1 is not limited to the ERR terminal, and it may be an arbitrary terminal for receiving the OTF signal OTF. The CA signal may be input to the memory device 20 through the second terminal P2. The CA signal may include a command and an address. The test device 10 may be configured to provide the command and the address to the memory device 20 to control memory operations, such as an access to the memory cell array 24, a read, or a write. The data may be transmitted to the test device 10 from a memory cell array 24 according to the read operation, and the data may be transmitted to the memory cell array 24 from the test device 10 according to the write operation. The test device 10 may be configured to transmit one command CMD to the memory device 20 in concert with at least one clock signal transition. For example, the test device 10 may transmit one command CMD to the memory device 20 across eight clock signal transitions, that is, the clock signal CLK transitions eight times for one command CMD transmission.

The CA signal may be input to the memory device 20 through two other terminals. For example, the terminal to which the command is input may be different from the terminal to which the address is input. The OTF signal OTF may be input to the memory device 20 through one of the command terminals for receiving commands and the address terminal for receiving addresses.

The command may include an activate command, a read/write command, and a test mode register set TMRS command. The activate command may change a target row of the memory cell array 24 into an active state to write data to the memory cell array 24 or read data from the memory cell array 24. A memory cell of the target row may be activated (e.g., driven) in response to the activate command. The read/write command may perform a read or write operation in a target memory cell of the row changed to be in the active state. The test mode register set TMRS command may perform an operation for detecting a defect of the memory device 20. The defect of the memory device 20 may include an example in which the memory cell array 24 has a bad memory cell and an example in which a component in the data input and output circuit 23 has an error.

The clock signal CLK may be input to the memory device 20 through the third terminal P3. The clock signal CLK may be provided to the memory device 20 to control data inputs and outputs. The clock signal CLK may relate to an input rate of the OTF signal OTF. The clock signal CLK may relate to a transmitting rate of commands or addresses applied for performing a data input and output operation. The clock signal CLK may relate to an input and output rate of the data signal DQ.

The data signal DQ may be input to the memory device 20 through a data input/output terminal DQP. The data signal DQ may include data to be written to the memory cell array 24 or may include data stored in the memory cell array 24 and read therefrom.

The data signal DQ may include input data or output data. The input data may be used in generating test data to be written to the memory cell array 24 together with the OTF signal OTF input through the first terminal P1. The output data may include the test data stored in the memory cell array 24 and read therefrom.

The test device 10 may be configured to transmit the OTF signal OTF and the data signal DQ including input data together with the command CMD including a write command to the memory device 20. The test device 10 may be configured to transmit the OTF signal OTF together with the command CMD including a read command to the memory device 20, and may receive output data provided by the memory device 20 in response to the transmission. The test device 10 may be configured to compare the input data and the output data and may be configured to determine whether the memory device 20 is operating normally.

For example, the test device 10 may be configured to transmit the data signal DQ modulated according to a first signal modulation method to the memory device 20. For example, the first signal modulation method may be a modulation method (i.e., an NRZ method) including two levels. The test device 10 may be configured to transmit the first data modulated by the NRZ method to the memory device 20 to write the data to the memory device 20, and may be configured to compare the second data modulated by the NRZ method and read from the memory device 20 to test the memory device 20. The memory device 20 may include a timing circuit 21, a command decoder 22, a data input and output circuit 23, and a memory cell array 24.

The timing circuit 21 may be configured to generate clock signals for operating components in the memory device 20.

The command decoder 22 may be configured to receive a CA signal including a command and an address from the test device 10, and may be configured to control the memory device 20 based on the CA signal.

The data input and output circuit 23 may be configured to transmit the data provided by the test device 10 to the memory cell array 24, or may be configured to transmit the data stored in the memory cell array 24 and read therefrom to the test device 10.

The memory cell array 24 includes a plurality of memory cells connected to rows and columns. The rows may be defined by word lines, and the columns may be defined by bit lines.

Figure 2:
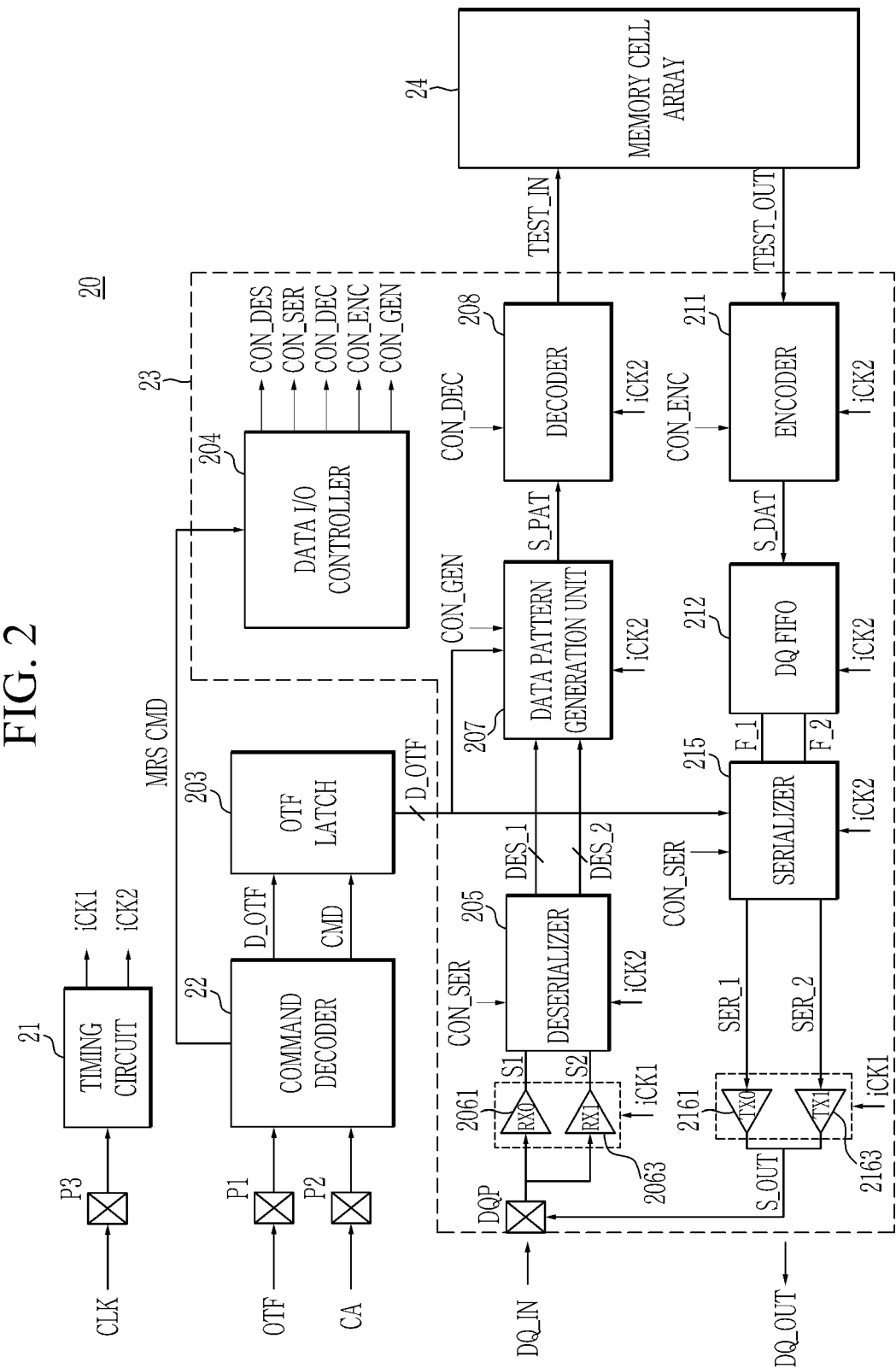
FIG. 2 illustrates a memory device according to an embodiment.
Figure 3:
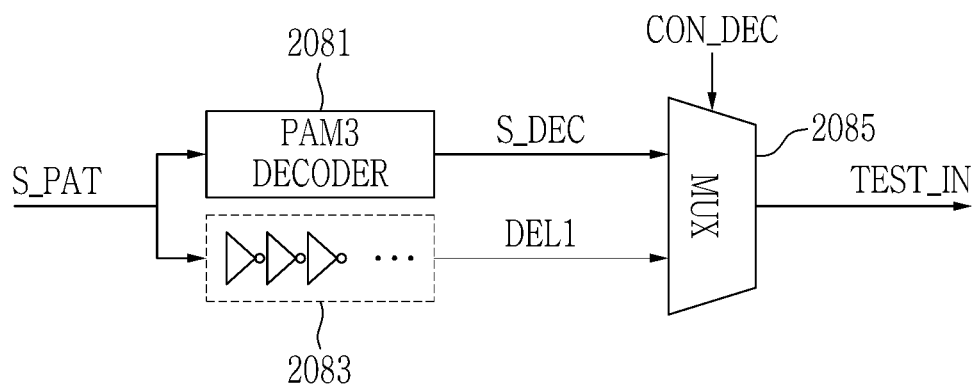
FIG. 3 is a block diagram of a configuration of an encoder according to an embodiment.
Figure 4:
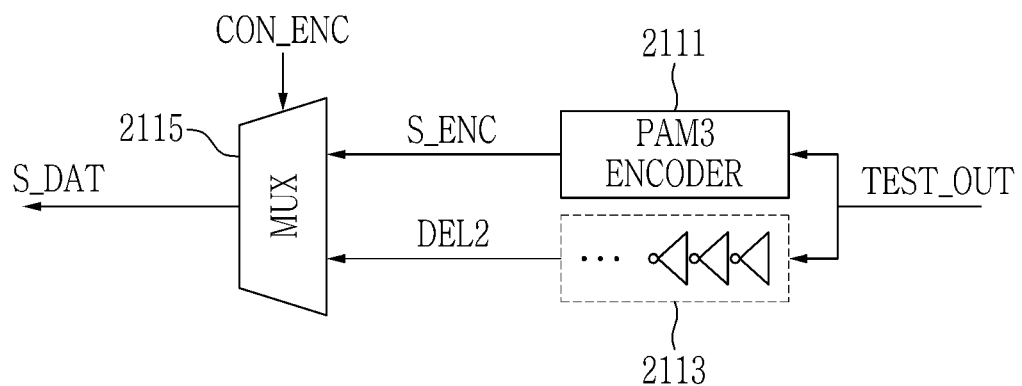
FIG. 4 is a block diagram of a configuration of a decoder according to an embodiment.

The memory device 20 will now be descried in detail with reference to FIG. 2 to FIG. 4.

FIG. 2 illustrates a memory device according to an embodiment, FIG. 3 is a block diagram of a configuration of an encoder according to an embodiment, and FIG. 4 is a block diagram of a configuration of a decoder according to an embodiment.

Referring to FIG. 2, the memory device 20 may include a timing circuit 21, a command decoder 22, a data input and output circuit DATA I/O CIRCUIT 23, and a memory cell array 24.

The memory device 20 may include a DRAM (Dynamic Random Access Memory), an SRAM (Static Random Access Memory), a mobile DRAM, a DDR SDRAM (Double Data Rate Synchronous Dynamic Random Access Memory), an LPDDR (Low Power DDR) SDRAM, a GDDR (Graphic DDR) SDRAM, and an RDRAM (Rambus Dynamic Random Access Memory). In another embodiment, the memory device 20 may include an EEPROM (Electrically Erasable Programmable Read-Only Memory), a flash memory, a PRAM (Phase Change Random Access Memory), an RRAM (Resistance Random Access Memory), an NFGM (Nano Floating Gate Memory), a PoRAM (Polymer Random Access Memory), an MRAM (Magnetic Random Access Memory), and/or an FRAM (Ferroelectric Random Access Memory). The memory device 20 is described herein as a DRAM, but embodiments of the present disclosure are not limited thereto.

The timing circuit 21 may be configured to receive the clock signal CLK from the test device 10 through a third terminal P3, and may generate clock signals for synchronizing internal signals based on the clock signal CLK. The memory device 20 may be operable in synchronization with a rising edge of the clock signal CLK or may be operable in synchronization with a falling edge.

The timing circuit 21 may be configured to double the input clock CLK. The timing circuit 21 may be configured to generate a first clock signal iCK1 and a second clock signal iCK2 based on the input clock CLK. The first clock signal iCK1 and the second clock signal iCK2 may have different frequencies. For example, the timing circuit 21 may double the input clock signal CLK frequency of 8 GHz to generate the clock signals at frequencies of 16 GHz and 32 GHz. In another embodiment, the timing circuit 21 may include dividers. The timing circuit 21 may include an exclusive OR (XOR) or a phase locked loop (PLL) circuit.

The command decoder 22 may be configured to generate a control signal so that the memory device 20 may perform a read operation, a write operation, or a test operation based on the OTF signal OTF input to the first terminal P1 and the CA signal input to the second terminal P2.

The command decoder 22 may be configured to capture the OTF signal OTF and the CA signal according to the clock signal CLK.

The command decoder 22 may be configured to decode the OTF signal OTF to generate OTF data D_OTF. The command decoder 22 may be configured to transmit the OTF data D_OTF to the OTF latch 203. The OTF data D_OTF may include a 1-bit OTF bit for each one transition of the first clock signal iCK1. For example, as the command decoder 22 may receive one command CMD from the test device 10 across eight transitions of the first clock iCK1, the command decoder 22 may be configured to transmit the 8-bit OTF data D_OTF to the OTF latch 203 while receiving the one command CMD.

Further, the command decoder 22 may be configured to decode the CA signal received from the test device 10 and may be configured to generate a control signal including a command signal and an address signal. The control signal may allow the memory device 20 to perform a read operation, a write operation, and/or a test operation. The memory device 20 may perform an operation that corresponds to the command signal of the memory cell in the memory cell array 24 corresponding to the address signal.

The command decoder 22 may generate a command CMD and a mode register set command MRS CMD based on the CA signal. The command decoder 21 may be configured to transmit the generated command CMD to the OTF latch 203. The command decoder 21 may also be configured to transmit the generated MRS command MRS CMD to the data input and output circuit 23.

The data input and output circuit 23 may be configured to store the data transmitted from an external source outside (i.e., from the test device 10 of FIG. 1) of the memory device 20 in the memory cell array 24 or may output the data stored in the memory cell array 24 to an external destination outside of the memory device 20.

The data input and output circuit 23 may sample input data DQ_IN received from the test device 10 based on the clock signal CLK. In detail, the data input and output circuit 23 may be configured to sample the input data DQ_IN received from the test device 10 based on edges of respective timings of the clock signal CLK received from the test device 10.

Meanwhile, the data input and output circuit 23 may be configured to transform the input data DQ_IN modulated by the first signal modulation method received from the test device 10 into test data TEST_IN modulated by the second signal modulation method. For example, the second signal modulation method may be a modulation method (e.g., PAM-3 or PAM-4 method) including at least three levels.

The data input and output circuit 23 may be configured to transform the data output by the memory cell array 24 into output data DQ_OUT of a first signal type. For example, the data input and output circuit 23 may be configured to transform test check data TEST_OUT into the output data DQ_OUT of a first signal type. The data input and output circuit 23 may include an OTF latch 203, a data input and output controller 204, receivers 2061 and 2063, a deserializer 205, a data pattern generator 207, a decoder 208, an encoder 211, a data first in first out (FIFO) circuit 212, a serializer 215, and transmitters 2161 and 2163.

The OTF latch 203 may be configured to store the OTF data D_OTF transmitted from the command decoder 22. The OTF latch 203 may provide the OTF data D_OTF to the data pattern generator 207.

The OTF latch 203 may be synchronized with a time when the data pattern generator 207 receives input data DQ_IN from the deserializer 205, and may be configured to provide the OTF data D_OTF to the data pattern generator 207. The memory device 20 may be configured to receive a command CMD from the command decoder 22, and may receive input data DQ_IN after a predetermined latency. The OTF latch 203 may be configured to provide the stored OTF data D_OTF to the data pattern generator 207 at an appropriate time. For example, the OTF latch 203 may provide 8-bit OTF data D_OTF to the data pattern generator 207.

The OTF latch 203 may be configured to provide the OTF data D_OTF to the serializer 215.

The data input and output controller 204 may be configured to receive the MRS command MRS CMD from the command decoder 21 and may be configured to generate control signals.

The control signals may include a first control signal CON_DES, a decoder control signal CON_DEC, a generator control signal CON_GEN, a second control signal CON_SER, and an encoder control signal CON_ENC.

The first control signal CON_DES may indicate a method for parallelizing a first signal S1 and a second signal S2 received by the deserializer 205 through the receivers 2061 and 2063 into a first deserialized signal DES_1 and a second deserialized signal DES_2.

The decoder control signal CON_DEC may indicate whether to output a signal when the decoder 208 is in a first mode or output a signal when it is in a second mode. Here, the memory device 20 may be configured to perform a read/write operation in the first mode, and the memory device 20 may be configured to perform a test in the second mode.

The generator control signal CON_GEN may indicate a method for the data pattern generator 207 to process the deserialized signals DES_1 and DES_2 and generate a pattern signal S_PAT. For example, the deserialized signals DES_1 and DES_2 may have 16 bits. For example, the generator control signal CON_GEN may indicate a method for generating the pattern signal S_PAT by using at least one of the first deserialized signal DES_1 and the second deserialized signal DES_2. As will be described below, the test data TEST_IN may be the pattern signal S_PAT delayed through the decoder 208. For another example, the generator control signal CON_GEN may indicate the OTF bit in the OTF data OTF corresponding to the respective bits in the deserialized signals DES_1 and DES_2.

The generator control signal CON_GEN may be used in generating the pattern signal S_PAT and not the OTF data D_OTF.

The second control signal CON_SER may indicate which one of the first signal F_1 and the second signal F_2 output by the DQ FIFO circuit 212 the serializer 215 will select and generate the first serialized signal SER_1 and/or the second serialized signal SER_2. For example, the first signal F_1 and the second signal F_2 may respectively have 16 bits. The first serialized signal SER_1 and the second serialized signal SER_2 may respectively have 8 bits. The second control signal CON_SER may indicate to select 8 bits from the 16-bit first signal F_1 and the second signal F_2. For another example, the first signal F_1 and the second signal F_2 may respectively have 32 bits. The second control signal CON_SER may indicate a method for selecting 8 bits from the 32-bit first signal F_1 and the second signal F_2.

The encoder control signal CON_ENC may indicate whether to output the signal when the encoder 211 is in the first mode or output the signal when it is in the second mode. Here, the memory device 20 may perform a read/write operation in the first mode, and the memory device 20 may perform a test in the second mode.

The receivers 2061 and 2063 may be configured to sample the input data DQ_IN based on the first clock signal iCK1. A first reference voltage Vref1 may be set for the first receiver 2061, and a second reference voltage Vref2 may be set for the second receiver 2063. The first reference voltage Vref1 may correspond to a most significant bit (MSB), and the second reference voltage Vref2 may correspond to a least significant bit (LSB). The first receiver 2061 may be configured to compare the input data DQ_IN and the first reference voltage Vref1, may be configured to sample a resultant signal, and may be configured to generate the first signal S1. The second receiver 2063 may be configured to compare the input data DQ_IN and the second reference voltage Vref2, may be configured to sample a resultant signal, and may be configured to generate the second signal S2.

The deserializer 205 may be configured to generate the deserialized signals DES_1 and DES_2 based on the second clock signal iCK2. The deserializer 205 may be configured to generate a deserialized signal DES based on the first signal S1 output by the first receiver 2061 and the second signal S2 output by the second receiver 2063 based on the first control signal CON_DES. The deserializer 205 may be configured to select the method for generating the first deserialized signal DES_1 and the second deserialized signal DES_2 based on the first control signal CON_DES. The method for generating the first deserialized signal DES_1 and the second deserialized signal DES_2 may be preset. The deserializer 205 may be a 1:16 data deserializer. For example, the first deserialized signal DES_1 and the second deserialized signal DES_2 may respectively have 16 bits.

The deserializer 205 may be configured to generate the first deserialized signal DES_1 based on the first signal S1, and may be configured to generate the second deserialized signal DES_2 based on the second signal S2. The deserializer 205 may be configured to generate the first deserialized signal DES_1 based on the first signal S1 and the second signal S2, and may be configured to generate the second deserialized signal DES_2 based on the first signal S1 and the second signal S2. In another embodiment, the deserializer 205 may be configured to select one of the first signal S1 and the second signal S2, and may be configured to generate the first deserialized signal DES_1 and the second deserialized signal DES_2 based on the selected signal.

The deserializer 205 may be configured to parallelize respective bits of the first signal S1 to generate the deserialized signal DES_1. For example, the deserialized signal DES_1 may have 16 bits. The deserializer 205 may include a plurality of samplers. The deserializer 205 may be configured to parallelize the first signal S1 based on the second clock signal iCK2. The deserializer 205 may be configured to sample the first signal S1 at an edge of the second clock signal iCK2 and may be configured to generate the first deserialized signal DES_1. Similarly, the deserializer 205 may be configured to sample the first signal S1 at the respective edges of the second clock signal iCK2 and may be configured to generate the first deserialized signal DES_1. In a similar way, the deserializer 205 may be configured to sample the second signal S2 and may be configured to generate the second deserialized signal DES_2. For example, the deserialized signal DES_2 may have 16 bits.

The deserializer 205 may be configured to transmit the first deserialized signal DES_1 and the second deserialized signal DES_2 to the data pattern generator 207.

The data pattern generator 207 may be configured to generate the pattern signal S_PAT based on the second clock signal iCK2. For example, the pattern signal S_PAT may have 32 bits. In detail, the data pattern generator 207 may be configured to receive the first deserialized signal DES_1 and the second deserialized signal DES_2 from the deserializer 205, and may be configured to generate the pattern signal S_PAT based on the OTF data D_OTF transmitted from the OTF latch 203. In another embodiment, the data pattern generator 207 be configured to receive the first deserialized signal DES_1 and the second deserialized signal DES_2 from the deserializer 205, and may be configured to generate the pattern signal S_PAT based on the control signal CON_GEN received from the data input and output controller 204. The data pattern generator 207 may be configured to transmit the generated pattern signal S_PAT to the decoder 208.

The decoder 208 may be configured to decode the pattern signal S_PAT based on the second clock signal iCK2, or may be configured to delay the pattern signal S_PAT and may be configured to transmit a resultant signal to the memory cell array 24.

Referring to FIG. 3, the decoder 208 may include a PAM3 decoder 2081, a first delay portion 2083, and a first MUX 2085.

The PAM3 decoder 2081 may be configured to decode the pattern signal S_PAT to generate a decoding signal S_DEC.

The first delay portion 2083 may be configured to delay the pattern signal S_PAT for a predetermined time to generate a delay signal DEL1. The first delay portion 2083 is shown to include three inverters in FIG. 3, embodiments of the present disclosure are not limited thereto, and the first delay portion 2083 may include an arbitrary number of inverters. The first delay portion 2083 may be configured with an appropriate component for delaying the pattern signal S_PAT for a predetermined time.

The first MUX 2085 may be configured to receive the decoding signal S_DEC from the PAM3 decoder 2081 and the delay signal DEL1 from the first delay portion 2083, and may be configured to transmit one signal selected based on the decoder control signal CON_DEC to the memory cell array 24 as the test data TEST_IN.

The first MUX 2085 may, when receiving the decoder control signal CON_DEC indicating the first mode, output the decoding signal S_DEC as the test data TEST_IN. The first MUX 2085 may, when receiving the decoder control signal CON_DEC indicating the second mode, output the delay signal DEL1 as the test data TEST_IN.

Referring to FIG. 2, the encoder 211 may be configured to encode the test check data TEST_OUT output by the memory cell array 24 based on the second clock signal iCK2, or may be configured to delay the test check data TEST_OUT and may be configured to transmit resultant data to the data FIFO circuit 212.

Referring to FIG. 4, the encoder 211 may include a PAM3 encoder 2111, a second delay portion 2113, and a second MUX 2115.

The PAM3 encoder 2111 may be configured to generate an encoding signal S_ENC by encoding the test check data TEST_OUT.

The second delay portion 2113 may be configured to generate a delay signal DEL2 by delaying the test check data TEST_OUT for a predetermined time. The second delay portion 2113 is shown to include three inverters in FIG. 4, embodiments of the present disclosure are not limited thereto, and the second delay portion 2113 may include an arbitrary number of inverters. The second delay portion 2113 may be configured with an appropriate component for delaying the test check data TEST_OUT for a predetermined time.

The second MUX 2115 may be configured to receive the encoding signal S_ENC from the PAM3 encoder 2111 and the delay signal DEL2 from the second delay portion 2113, and may be configured to transmit one signal selected based on the encoder control signal CON_ENC to the data FIFO circuit 212 as a data signal S_DAT.

The second MUX 2115 may, when receiving the encoder control signal CON_ENC indicating the first mode, output the encoding signal S_ENC as the data signal S_DAT. The second MUX 2115 may, when receiving the encoder control signal CON_ENC indicating the second mode, output the delay signal DEL2 as the data signal S_DAT. Here, the memory device 20 may be configured to perform a read/write operation in the first mode, and the memory device 20 may be configured to perform a test in the second mode.

When the MRS command MRS CMD indicates the read/write mode, the data input and output controller 204 may be configured to output the decoder control signal CON_DEC and the encoder control signal CON_ENC so that the decoder 208 and the encoder 211 may be operable in the first mode that is a coding mode.

When the MRS command MRS CMD indicates the test mode, the data input and output controller 204 may be configured to output the decoder control signal CON_DEC and the encoder control signal CON_ENC so that the decoder 208 and the encoder 211 may be operable in the second mode that is a non-coding mode.

The data FIFO circuit 212 may be configured to divide the data signal S_DAT into a first signal F_1 and a second signal F_2 and may be configured to output the same based on the second clock signal iCK2. For example, the data signal S_DAT may have 32 bits. For example, the first signal F_1 and the second signal F_2 may have 16 bits.

For example, the data FIFO circuit 212 may allocate sixteen initial bits of the data signal S_DAT to be the first signal F_1 and may allocate the next received sixteen bits to be the second signal F_2 according to the order of receiving the data signal S_DAT from the encoder 211.

The serializer 215 may be configured to generate the serialized signals SER_1 and the SER_2 based on the second clock signal iCK2. The serializer 215 may be configured to generate the first serialized signal SER_1 and/or the second serialized signal SER_2 based on the second control signal CON_SER received from the data input and output controller 204 and the OTF data D_OTF received from the OTF latch 203. The serializer 215 may be configured to select a method for generating the first serialized signal SER_1 and/or the second serialized signal SER_2 from the first signal F_1 and second signal F_2 based on the second control signal CON_SER. The serializer 215 may be configured to select a method for generating the first serialized signal SER_1 and the second serialized signal SER_2 from the first signal F_1 and the second signal F_2 corresponding to the method for the data pattern generator 207 to generate the pattern signal S_PAT from the first deserialized signal DES_1 and the second deserialized signal DES_2. For example, the data pattern generator 207 may be configured to generate a new bit among respective bits and may add the new bit thereto according to an arbitrary first method to thereby generate the pattern signal S_PAT in the first deserialized signal DES_1 and the second deserialized signal DES_2. The first method includes alternately arranging a plurality of bits and new bits in the first deserialized signal DES_1, and generating the new bits based on the bit of the first deserialized signal DES_1 disposed near the left, i.e., among the more significant bits, and the OTF data D_OTF. In this instance, the serializer 215 may respectively select eight bits in the 16-bit first signal F_1 and the second signal F_2 by using a second method that corresponds to the first method. The second method may include selecting the bit arranged at the (2n−1)-th (n is a natural number) position or the bit arranged at the (2m−2)-th (m is a natural number) position in the first signal F_1 and the second signal F_2. To summarize, the data input and output controller 204 may select a method for the serializer 215 to generate the serialized signals SER_1 and SER_2 corresponding to the method for the data pattern generator 207 to generate the pattern signal S_PAT.

Many methods for generating the first serialized signal SER_1 and the second serialized signal SER_2 may be preset. The serializer 215 may be configured to select an arbitrary method from among many predetermined methods, and may generate the first serialized signal SER_1 and the second serialized signal SER_2 from the first signal F_1 and the second signal F_2 according to the selected method. The serializer 215 may be configured to generate the first serialized signal SER_1 or the second serialized signal SER_2.

The transmitters 2161 and 2163 may be configured to generate an output signal S_OUT from the first serialized signal SER_1 and the second serialized signal SER_2 based on the first clock signal iCK1. The first transmitter 2161 may be configured to receive the first serialized signal SER_1, and the second transmitter 2163 may be configured to receive the second serialized signal SER_2. The transmitters 2161 and 2163 may be configured to transform the received first serialized signal SER_1 and the second serialized signal SER_2 into two levels and may be configured to generate the output signal S_OUT. For example, the output signal S_OUT may have 8 bits.

An output terminal of the first transmitter 2161 and an output terminal of the second transmitter 2163 may be connected to the data output terminal DQP.

The output signal S_OUT may be output as output data DQ_OUT to the test device 10.

Test data TEST_IN may be written to the memory cell array 24, and the memory cell array 24 may output the test check data TEST_OUT.

The test device 10 may be configured to determine an expected output data DQ_OUT based on the input data DQ_IN provided through the data input/output terminal DQP of the memory device 20 and the OTF data provided through the first terminal P1. The test device 10 may be configured to compare the output data DQ_OUT provided through the data output terminal DQP of the memory device 20 and the expected output data DQ_OUT and may be configured to determine whether the memory device 20 is operating normally. In detail, the test device 10 may be configured to determine that the memory device 20 is operating normally when the output data DQ_OUT are identical with the expected output data DQ_OUT, and the test device 10 may be configured to determine that the memory device 20 is not operating normally when the output data DQ_OUT are different from the expected output data DQ_OUT.

It has been described with reference to FIG. 3, for better understanding and ease of description, that the test device 10 is configured to output a data input signal based on an NRZ method as a test signal and the memory device 20 is operated by a PAM3 method, but embodiments of the present disclosure are not limited thereto, and the memory device 20 may be operated by a PAM-M method (here, M is a natural number that is equal to or greater than 2). For example, when the data input and output signal is transmitted between the data input and output circuit 23 and the memory cell array 24 according to the PAM-M method (here, M is a natural number that is equal to or greater than 2), the data input and output signal may be generated to have one of first to M-th voltage levels. In this case, the data input and output signal transmitted by the PAM-M method may be sampled based on first to (M−1)-th reference voltages.

Figure 5:
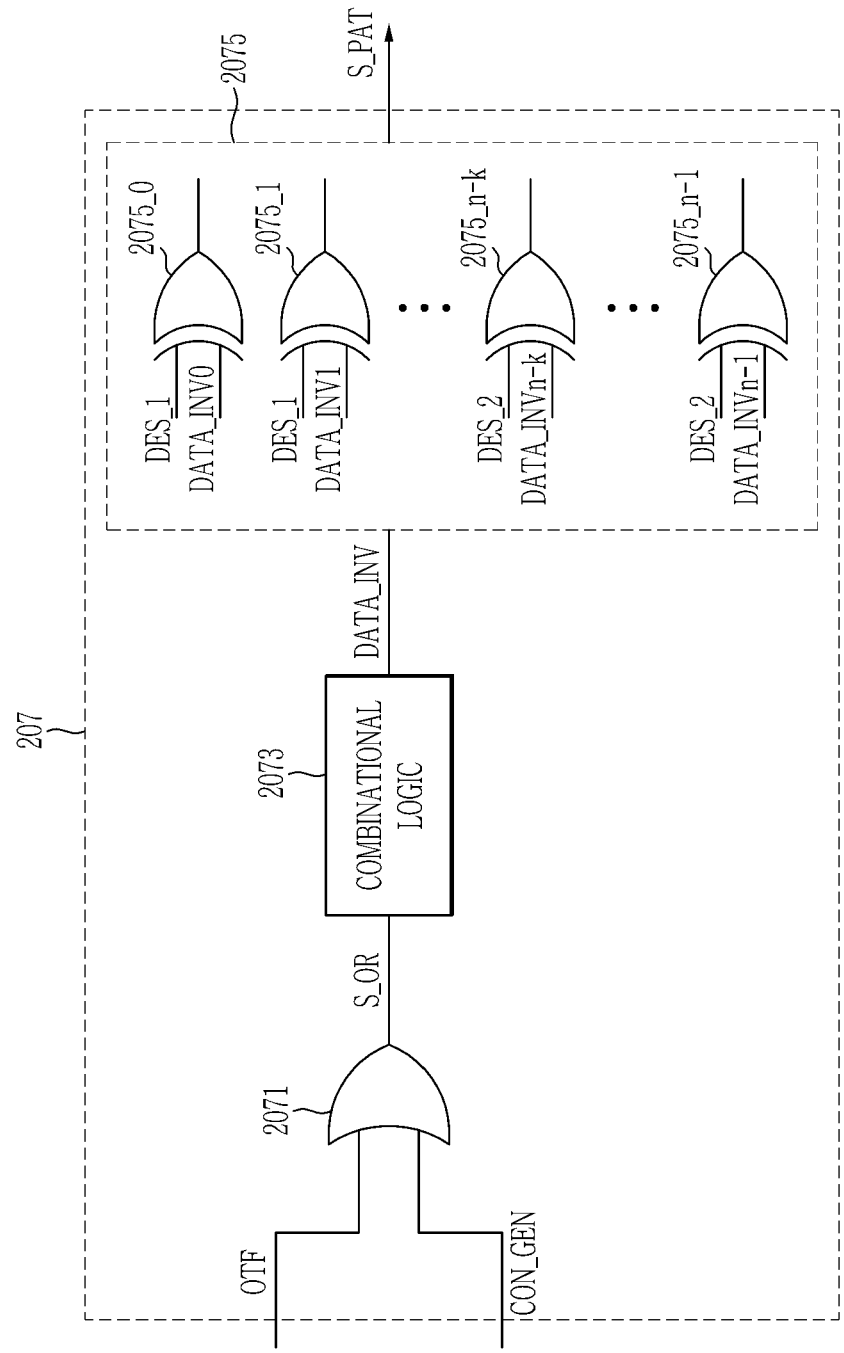
FIG. 5 is a block diagram of a configuration of a data pattern generator according to an embodiment.

FIG. 5 is a block diagram of a configuration of a data pattern generator according to an embodiment.

Referring to FIG. 5, the data pattern generator 207 may include an OR gate 2071, a combination logic 2073, and an inversion unit 2075.

The OR gate 2071 may be configured to perform an OR operation on the OTF data D_OTF provided by the OTF latch 203 and the control signal CON_GEN provided by the data input and output controller 204 to output an OR signal S_OR.

The combination logic 2073 may be configured to receive the OR signal S_OR from the OR gate 2071 and may be configured to output an inverted data signal DATA_INV. The OR signal S_OR may be 8-bit OTF data. The combination logic 2073 may be configured to generate a new 32-bit OTF value based on the 8-bit OTF data D_OTF. For example, the combination logic 2073 may arbitrarily add 24 data having the value of 0 or 1 among the 8-bit OTF data D_OTF and may generate a new 32-bit OTF value. For another example, the combination logic 2073 may repeatedly arrange the 8-bit OTF data D_OTF four times and may generate a new 32-bit OTF value. The combination logic 2073 may generate an OTF value from the OTF data D_OTF by an arbitrary method.

The combination logic 2073 may be configured to output the generated 32-bit OTF value as an inverted data signal DATA_INV. In another embodiment, the combination logic 2073 may be configured to output the control signal CON_GEN provided by the data input and output controller 204 as an inverted data signal DATA_INV. The control signal CON_GEN may have 32 bits.

The inversion unit 2075 may include a plurality of XOR gates 2075_0, 2075_1, . . . , 2075_$n$-1. Here, the n may be 32. The deserialized signals DES_1; DES_2 output by the deserializer 205 and the inverted data signal DATA_INV output by the combination logic 2073 may be applied to input terminals of the XOR gates 2075_0, 2075_1, . . . , 2075_$n$-1. The respective XOR gates 2075_0, 2075_1, . . . , 2075_$n$-1 may be configured to perform an XOR operation on the input deserialized signals DES_1 and DES_2 and the inverted data signal DATA_INV.

Signals output by the XOR gates 2075_0, 2075_1, . . . , 2075_$n$-1 in the inversion unit 2075 may be transmitted to the decoder 208 as the pattern signal S_PAT.

To summarize, the data pattern generator 207 may be configured to generate the 32-bit pattern signal S_PAT by combining the deserialized signals DES_1; DES_2 including the 8-bit OTF data D_OTF and the 32-bit data according to many predetermined methods. For example, the data pattern generator 207 may be configured to determine whether to arrange data that have the same value as the data in the deserialized signals DES_1; DES_2 according to the inverted data DATA_INV generated by a combination logic, or invert some of the data that have the opposite value to the data in the deserialized signals DES_1; DES_2 and arrange the inverted data, and may be configured to generate the pattern signal S_PAT.

Figure 6:
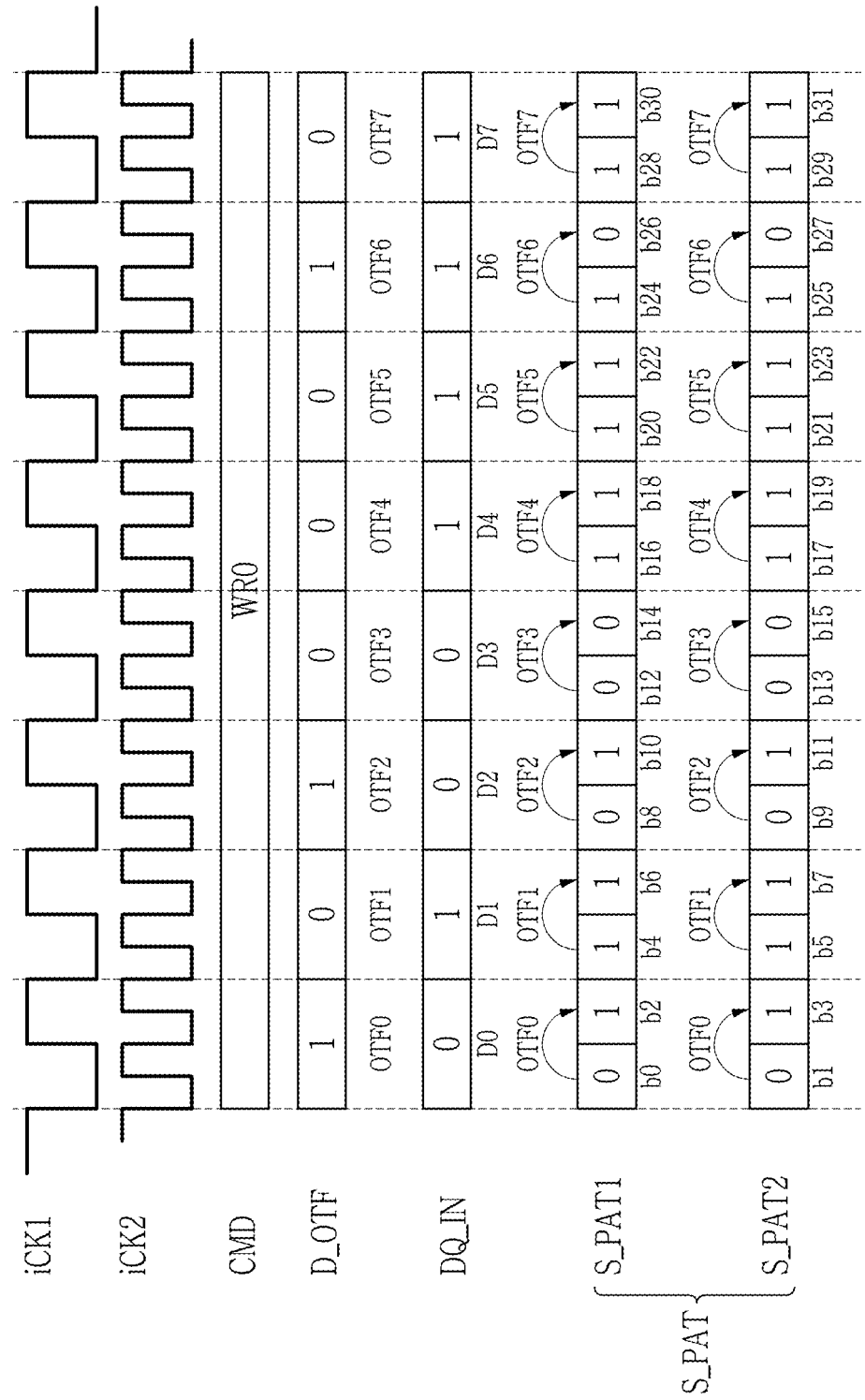
FIG. 6 illustrates an operation of a data pattern generator according to an embodiment.

FIG. 6 illustrates an operation of a data pattern generator according to an embodiment.

For better understanding and ease of description, referring to FIG. 6, the clock signals iCK1 and iCK2, the command CMD, the OTF data D_OTF, the input data DQ_IN, and the generated pattern signals S_PAT1 and S_PAT2 are shown to be set with respect to the same timing. However, in actuality, the memory device 20 may be configured to receive the command CMD and the OTF data D_OTF from the test device 10, and may be configured to generate the pattern signals S_PAT1 and S_PAT2 based on the OTF data D_OTF received by the data pattern generator 207 after a predetermined write latency.

The data pattern generator 207 may be configured to receive one command CMD for eight first clock signals iCK1, and may be configured to receive 8-bit OTF data D_OTF. Simultaneously or in coordination with the data pattern generator 207, the memory device 20 may be configured to receive 8-bit (D0, D1, ..., D7) input data DQ_IN.

The first pattern signal S_PAT1 may be generated based on the first deserialized signal DES_1, and the second pattern signal S_PAT2 may be generated based on the second deserialized signal DES_2.

The deserializer 205 may be configured to generate 16-bit deserialized signals DES_1 and DES_2 based on the 8-bit input data DQ_IN, and the data pattern generator 207 may be configured to generate 32-bit pattern signals S_PAT1 and S_PAT2 from the 16-bit deserialized signals DES_1 and DES_2 based on the 8-bit OTF data D_OTF. The data pattern generator 207 may be configured to generate the first pattern signal S_PAT1 and the second pattern signal S_PAT2 by using bit values (OTF0, ..., OTF7 of the OTF data D_OTF) of the OTF data D_OTF.

In detail, the data pattern generator 207 may be configured to generate the 16-bit first pattern signal S_PAT1 based on the clock signal iCK2. Referring to FIG. 6, the 16-bit values included by the first pattern signal S_PAT1 are shown to be b0, b2, b4, ..., b30. The data pattern generator 207 may be configured to arrange new data among the respective data of the received input data DQ_IN and may be configured to generate the pattern signal S_PAT1. The data pattern generator 207 may be configured to arrange the input data D0, D1, D2, ..., D7 on the respective positions of b0, b4, b8, ..., b28. The data pattern generator 207 may be configured to determine b2, b4, b6, ..., b30 according to the value of the OTF bit in the OTF data D_OTF. For example, the data pattern generator 207 may be configured to determine the value of b2 based on the values of b0 and OTF0, may be configured to determine the value of b6 based on the values of b4 and OTF1, may be configured to determine the value of b10 based on the values of b8 and OTF2, may be configured to determine the value of b14 based on the values of b12 and OTF3, may be configured to determine the value of b18 based on the values of b16 and OTF4, may be configured to determine the value of b22 based on the values of b20 and OTF5, may be configured to determine the value of b26 based on the values of b24 and OTF6, and may be configured to determine the value of b30 based on the values of b28 and OTF7.

In detail, when the OTF bit is 1 (high), the data pattern generator 207 may be configured to determine that b2 has the inverted value of b0 from among the input data DQ_IN. That is, b2 may have the value of 1. When the OTF bit is 0 (low), the data pattern generator 207 may be configured to determine that b6 has the same value as b4 from among the input data DQ_IN. That is, b6 may have the value of 1. According to a similar method, the data pattern generator 207 may be configured to determine the values of b2, b6, ..., b30 based on the respective values of OTF0 to OTF7.

In a like way, the data pattern generator 207 may be configured to generate the 16-bit second pattern signal S_PAT2 based on the clock signal iCK2. In FIG. 6, the respective sixteen bits included by the second pattern signal S_PAT2 are marked as b1, b3, b5, ..., b31. The data pattern generator 207 may be configured to arrange new data among the respective data of the received input data DQ_IN and may be configured to generate the pattern signal S_PAT2. The data pattern generator 207 may be configured to arrange the input data D0, D1, D2, ..., D7 at the positions of b1, b5, b9, ..., b29. The data pattern generator 207 may be configured to determine b3, b7, b11, ..., b31 according to the value of the OTF bit in the OTF data D_OTF. For example, the data pattern generator 207 may be configured to determine the value of b3 based on the values of b1 and OTF0, may be configured to determine the value of b7 based on the values of b5 and OTF1, may be configured to determine the value of b11 based on the values of b9 and OTF2, may be configured to determine the value of b15 based on the values of b13 and OTF3, may be configured to determine the value of b19 based on the values of b17 and OTF4, may be configured to determine the value of b23 based on the values of b21 and OTF5, may be configured to determine the value of b27 based on the values of b25 and OTF6, and may be configured to determine the value of b31 based on the values of b29 and OTF7.

The first pattern signal S_PAT1 and the second pattern signal S_PAT2 may be output from the data pattern generator 207 using the clock signal iCK2.

An example of the pattern signal S_PAT generated by the data pattern generator 207 is described with reference to FIG. 6. However, embodiments of the method for the data pattern generator 207 to generate 32 bits of b0, b1, b2, b3, ..., b31 are not limited thereto. For example, the data having the values of the input data of D0, D1, D2, ..., D7 are not limited to the positions of b0, b1, b4, b5, ..., b28, b29, and may be arranged to arbitrary positions from among the 32 bits. The data pattern generator 207 may be configured to use an arbitrary OTF bit from among OTF0 to OTF7 when determining new b2, b6, ..., b30 except input data.

Figure 7:
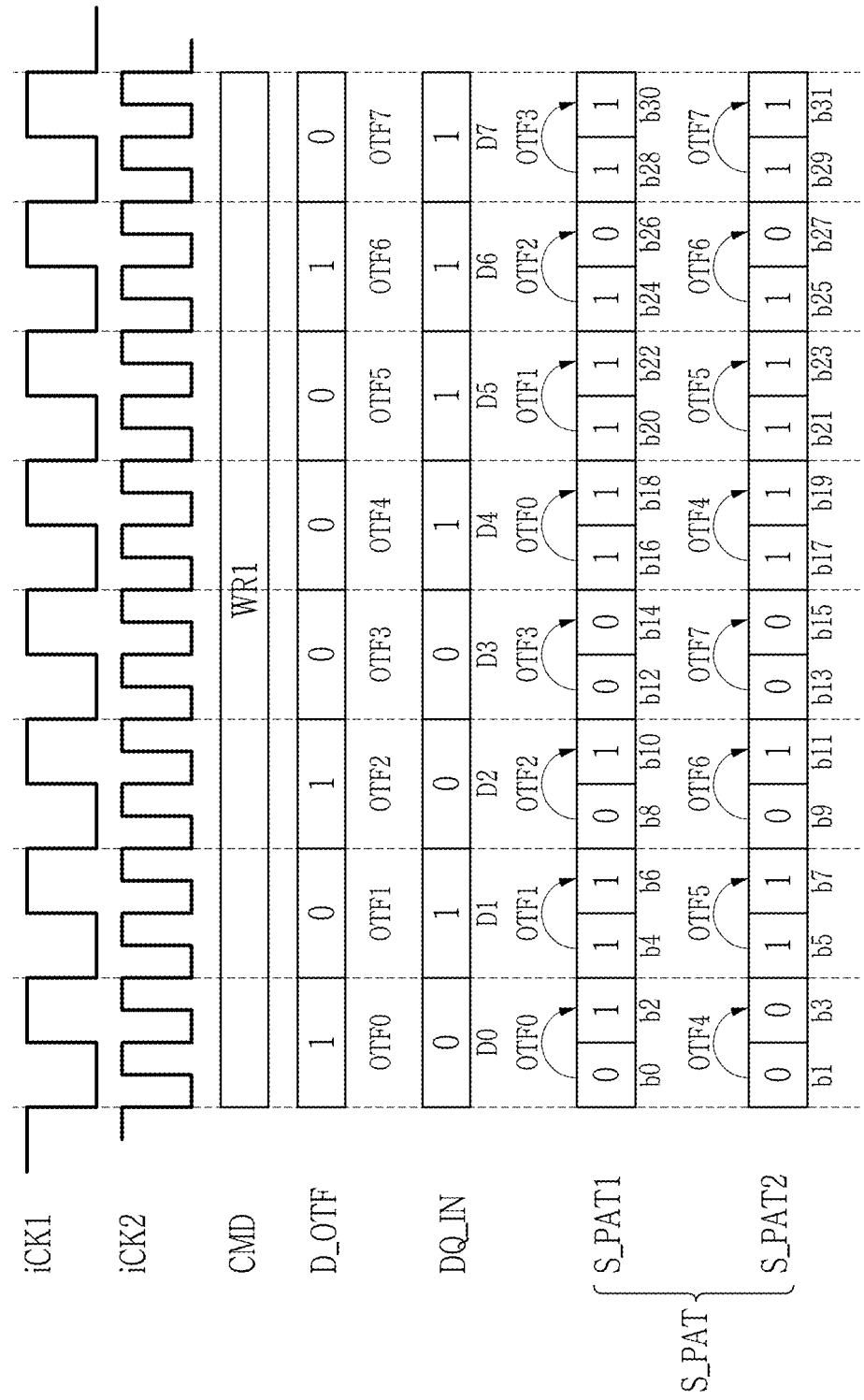
FIG. 7 illustrates an operation of a data pattern generator according to an embodiment.

FIG. 7 illustrates an operation of a data pattern generator according to an embodiment.

The description of the clock signals iCK1 and iCK2, the command CMD, the OTF data D_OTF, and the input data DQ_IN provided with reference to FIG. 6 may be applied to the clock signals iCK1 and iCK2, the command CMD, the OTF data D_OTF, and the input data DQ_IN shown in FIG. 7.

The data pattern generator 207 may be configured to generate the first pattern signal S_PAT1 and the second pattern signal S_PAT2 by using an individual OTF bit in the OTF data D_OTF. For example, the data pattern generator 207 may be configured to generate the first pattern signal S_PAT1 by using the bit values OTF0, OTF1, OTF2, and OTF3 of the OTF data D_OTF and may be configured to generate the second pattern signal S_PAT2 by using the bit values OTF4, OTF5, OTF6, and OTF7 of the OTF data D_OTF.

In detail, the data pattern generator 207 may be configured to generate a 16-bit first pattern signal S_PAT1 based on the clock signal iCK2. The 16-bit values included by the first pattern signal S_PAT1 are marked with b0, b2, b4, ..., b30. The data pattern generator 207 may be configured to arrange new data among the respective data of the received input data DQ_IN and may be configured to generate the pattern signal S_PAT1. The data pattern generator 207 may be configured to arrange the input data D0, D1, D2, ..., D7 at the positions of b0, b4, b8, ..., b28. The data pattern generator 207 may be configured to determine b2, b4, b6, ..., b30 disposed among b0, b4, b8, ..., b28 according to the value of the OTF bit in the OTF data D_OTF. For example, the data pattern generator 207 may be configured to determine the value of b2 based on the values of b0 and OTF0, may be configured to determine the value of b6 based on the values of b4 and OTF1, may be configured to determine the value of b10 based on the values of b8 and OTF2, and may be configured to determine the value of b14 based on the values of b12 and OTF3. The data pattern generator 207 may be configured to determine the value of b18 based on the values of b16 and OTF0, may be configured to determine the value of b22 based on the values of b20 and OTF1, may be configured to determine the value of b26 based on the values of b24 and OTF2, and may be configured to determine the value of b30 based on the values of b28 and OTF3.

The data pattern generator 207 may be configured to generate a 16-bit second pattern signal S_PAT2 based on the clock signal iCK2. The 16-bit values included by the second pattern signal S_PAT2 are marked as b1, b3, b5, . . . , b31. The data pattern generator 207 may be configured to arrange new data among the respective data of the received input data DQ_IN and may be configured to generate the pattern signal S_PAT2. The data pattern generator 207 may be configured to arrange the input data D0, D1, D2, . . . , D7 at the positions of b1, b5, b9, . . . , b29. The data pattern generator 207 may be configured to determine b3, b7, b11, . . . , b31 disposed among b1, b5, b9, . . . , b29 according to the value of the OTF bit in the OTF data D_OTF. For example, the data pattern generator 207 may be configured to determine the value of b3 based on the values of b1 and OTF4, may be configured to determine the value of b7 based on the values of b5 and OTF5, may be configured to determine the value of b11 based on the values of b9 and OTF6, may be configured to determine the value of b15 based on the values of b13 and OTF7, may be configured to determine the value of b19 based on the values of b17 and OTF4, may be configured to determine the value of b23 based on the values of b21 and OTF5, may be configured to determine the value of b27 based on the values of b25 and OTF6, and may be configured to determine the value of b31 based on the values of b29 and OTF7.

The first pattern signal S_PAT1 and the second pattern signal S_PAT2 may be output from the data pattern generator 207 using the clock signal iCK2.

An example of the pattern signal S_PAT generated by the data pattern generator 207 has been described with reference to FIG. 7. However, embodiments of the method for the data pattern generator 207 to generate the 32 bits of b0, b1, . . . , b31 are not limited thereto.

Figure 8:
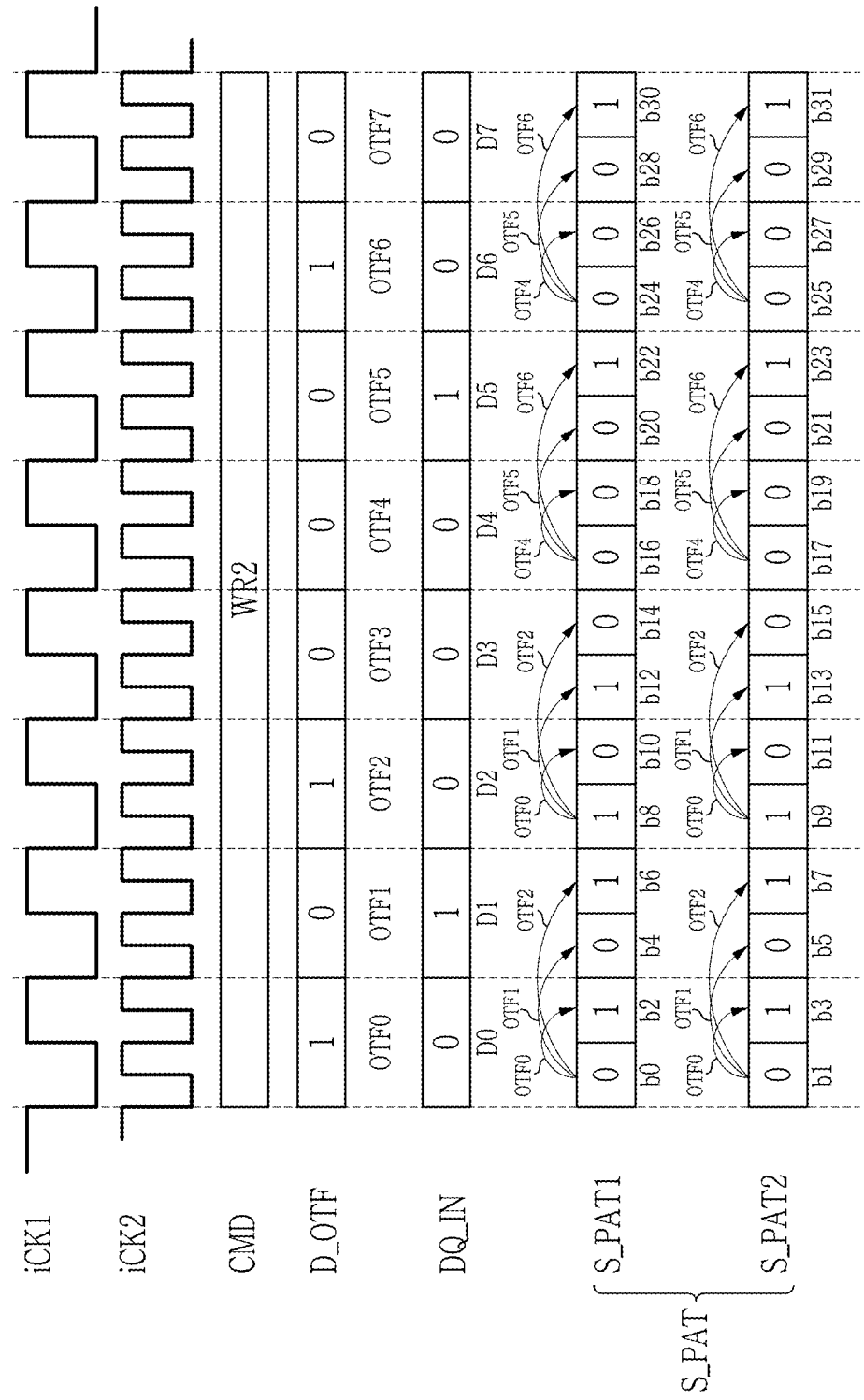
FIG. 8 illustrates an operation of a data pattern generator according to an embodiment.

FIG. 8 illustrates an operation of a data pattern generator according to an embodiment.

The description of the clock signals iCK1 and iCK2, the command CMD, the OTF data D_OTF, and the input data DQ_IN provided with reference to FIG. 6 may be applied to the clock signals iCK1 and iCK2, the command CMD, the OTF data D_OTF, and the input data DQ_IN shown in FIG. 8.

The first pattern signal S_PAT1 is generated based on the first deserialized signal DES_1, and the second pattern signal S_PAT2 is generated based on the second deserialized signal DES_2.

The deserializer 205 may be configured to generate 16-bit deserialized signals DES_1 and DES_2 based on the 4-bit input data DQ_IN, and the data pattern generator 207 may be configured to generate 32-bit pattern signals S_PAT1 and S_PAT2 from the 16-bit deserialized signals DES_1 and DES_2 based on the 8-bit OTF data D_OTF. The data pattern generator 207 may be configured to generate the first pattern signal S_PAT1 and the second pattern signal S_PAT2 by using the bit values OTF0, OTF1, OTF2, OTF4, OTF5, and OTF6 of the OTF data D_OTF.

In detail, the data pattern generator 207 may be configured to generate the 16-bit first pattern signal S_PAT1 based on the clock signal iCK2. The 16-bit values included by the first pattern signal S_PAT1 are marked as b0, b2, b4, . . . , b30 in FIG. 8. The data pattern generator 207 may be configured to arrange new data among the respective data of the received input data DQ_IN and may be configured to generate the pattern signal S_PAT1. The data pattern generator 207 may be configured to arrange the input data D0, D1, D2, and D3 at the positions of b0, b8, b16, and b24. The data pattern generator 207 may determine b2, b4, b6, b10, b12, b14, b18, b20, b22, b26, b28, and b30 according to the value of the OTF bit in the OTF data D_OTF. For example, the data pattern generator 207 may be configured to determine the value of b2 based on the values of b0 and OTF0, may be configured to determine the value of b4 based on the values of b0 and OTF1, and may be configured to determine the value of b6 based on the values of b0 and OTF2. The data pattern generator 207 may be configured to determine the value of b10 based on the values of b8 and OTF0, may be configured to determine the value of b12 based on the values of b8 and OTF1, and may be configured to determine the value of b14 based on the values of b8 and OTF2. The data pattern generator 207 may be configured to determine the value of b18 based on the values of b16 and OTF4, may be configured to determine the value of b20 based on the values of b16 and OTF5, and may be configured to determine the value of b22 based on the values of b16 and OTF6. The data pattern generator 207 may be configured to determine the value of b26 based on the values of b24 and OTF4, may be configured to determine the value of b28 based on the values of b24 and OTF5, and may be configured to determine the value of b30 based on the values of b24 and OTF6.

In a similar manner, the data pattern generator 207 may be configured to generate the 16-bit second pattern signal S_PAT2 based on the clock signal iCK2. The 16-bit values included by the second pattern signal S_PAT2 are marked as b1, b3, b5, . . . , b31. The data pattern generator 207 may be configured to arrange new data among the respective data of the received input data DQ_IN and may be configured to generate the pattern signal S_PAT2. The data pattern generator 207 may be configured to arrange the input data D0, D1, D2, and D3 at the positions of b1, b9, b17, and b25. The data pattern generator 207 may be configured to determine b3, b5, b7, b11, b13, b15, b19, b21, b23, b27, b29, and b31 according to the value of the OTF bit in the OTF data D_OTF. For example, the data pattern generator 207 may be configured to determine the value of b3 based on the values of b1 and OTF0, may be configured to determine the value of b5 based on the values of b1 and OTF1, may be configured to determine the value of b7 based on the values of b1 and OTF2, may be configured to determine the value of b11 based on the values of b9 and OTF0, may be configured to determine the value of b13 based on the values of b9 and OTF1, and may be configured to determine the value of b15 based on the values of b9 and OTF2. The data pattern generator 207 may be configured to determine the value of b19 based on the values of b17 and OTF4, may be configured to determine the value of b21 based on the values of b17 and OTF5, may be configured to determine the value of b23 based on the values of b17 and OTF6, may be configured to determine the value of b27 based on the values of b25 and OTF4, may be configured to determine the value of b29 based on the values of b25 and OTF5, and may be configured to determine the value of b31 based on the values of b25 and OTF6. The first pattern signal S_PAT1 and the second pattern signal S_PAT2 may be configured to output from the data pattern generator 207 using the clock signal iCK2.

An example of the pattern signal S_PAT generated by the data pattern generator 207 has been described with reference to FIG. 8. However, embodiments of the method for the data pattern generator 207 to generate 32 bits of b0, b1, b2, b3, . . . , b31 are not limited thereto. For example, the data having the values of the input data of D0, D1, D2, . . . , D7 are not limited to the positions of b0, b1, b8, b9, . . . , b24, b25, and may be arranged in arbitrary position from among the 16 bits. The data pattern generator 207 may be configured to use an arbitrary OTF bit from among OTF0 to OTF7 when determining new values b2, b6, . . . , b30 except input data.

Figure 9:
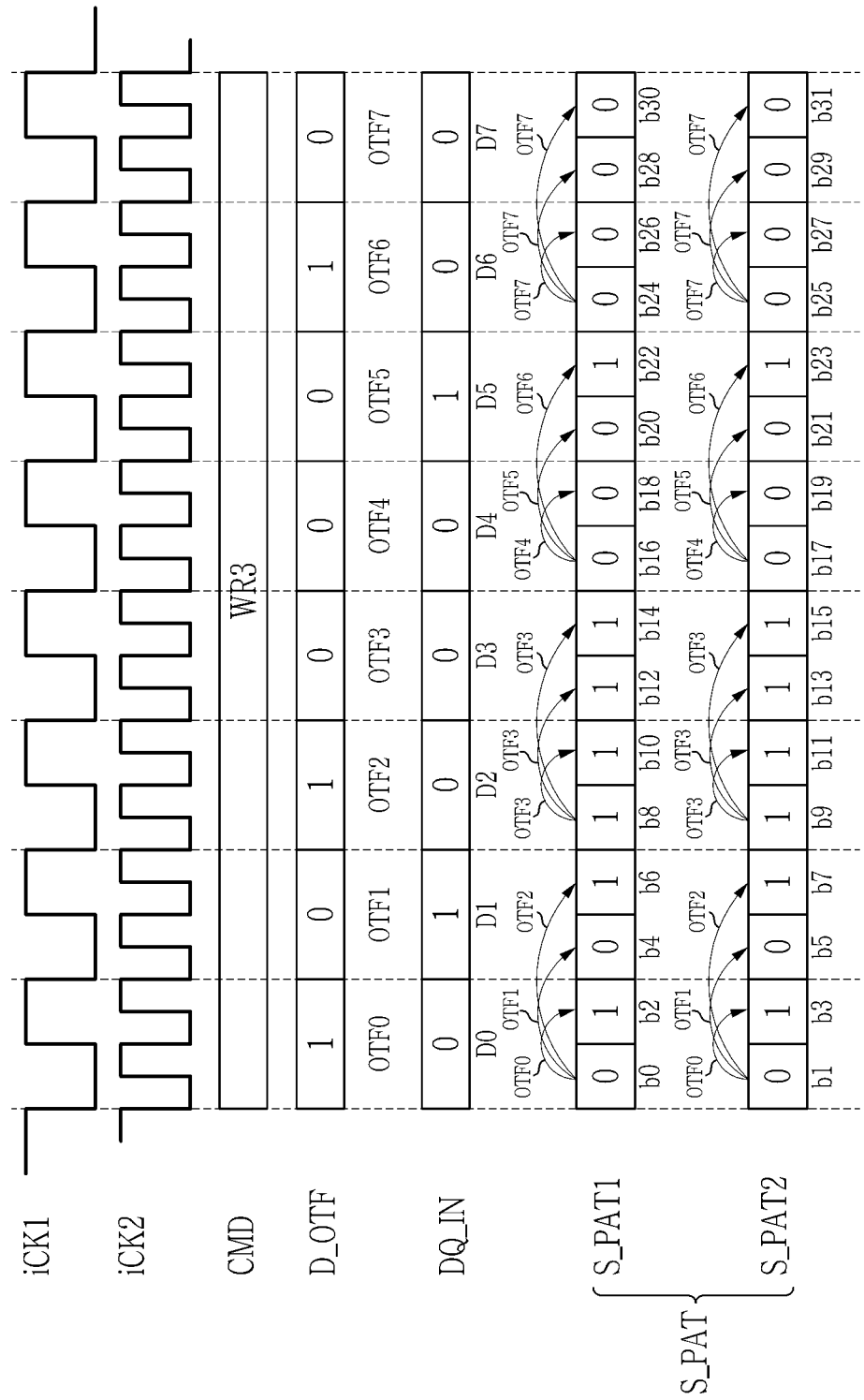
FIG. 9 illustrates an operation of a data pattern generator according to an embodiment.

FIG. 9 illustrates an operation of a data pattern generator according to an embodiment.

The description of the clock signals iCK1 and iCK2, the command CMD, the OTF data D_OTF, and the input data DQ_IN provided with reference to FIG. 8 may be applied to the clock signals iCK1 and iCK2, the command CMD, the OTF data D_OTF, and the input data DQ_IN shown in FIG. 9.

The first pattern signal S_PAT1 may be generated based on the first deserialized signal DES_1, and the second pattern signal S_PAT2 may be generated based on the second deserialized signal DES_2.

The deserializer 205 may be configured to generate 16-bit deserialized signals DES_1 and DES_2 based on the 4-bit input data DQ_IN, and the data pattern generator 207 may be configured to generate 32-bit pattern signals S_PAT1 and S_PAT2 from the 16-bit deserialized signals DES_1 and DES_2 based on the 4-bit OTF data D_OTF. The data pattern generator 207 may be configured to generate the first pattern signal S_PAT1 and the second pattern signal S_PAT2 by using the bit values OTF0, OTF1, OTF2, OTF3, OTF4, OTF5, OTF6, and OTF7 of the OTF data D_OTF.

As shown in FIG. 9, the data pattern generator 207 may be configured to determine the value of b2 based on the values of b0 and OTF0, may be configured to determine the value of b4 based on the values of b0 and OTF1, and may be configured to determine the value of b6 based on the values of b0 and OTF2. The data pattern generator 207 may be configured to determine the values of b10, b12, and b14 based on the values of b8 and OTF3. The data pattern generator 207 may be configured to determine the value of b18 based on the values of b16 and OTF4, may be configured to determine the value of b20 based on the values of b16 and OTF5, and may be configured to determine the value of b22 based on the values of b16 and OTF6. The data pattern generator 207 may be configured to determine the values of b26, b28, and b30 based on the values of b24 and OTF7.

In a similar manner, the data pattern generator 207 may be configured to determine the value of b3 based on the values of b1 and OTF0, may be configured to determine the value of b5 based on the values of b1 and OTF1, may be configured to determine the value of b7 based on the values of b1 and OTF2, and may be configured to determine the values of b11, b13, and b15 based on the values of b9 and OTF3. The data pattern generator 207 may be configured to determine the value of b19 based on the values of b17 and OTF4, may be configured to determine the value of b21 based on the values of b17 and OTF5, may be configured to determine the value of b23 based on the values of b17 and OTF6, may be configured to determine the value of b27 based on the values of b25 and OTF4, and may be configured to determine the values of b27, b29, and b31 based on the values of b25 and OTF7.

The first pattern signal S_PAT1 and the second pattern signal S_PAT2 may be output from the data pattern generator 207 using the clock signal iCK2.

An example of the pattern signal S_PAT generated by the data pattern generator 207 has been described with reference to FIG. 9. However, embodiments of the method for the data pattern generator 207 to generate the 32 bits of b0, b1, . . . , b31 are not limited thereto.

Figure 10:
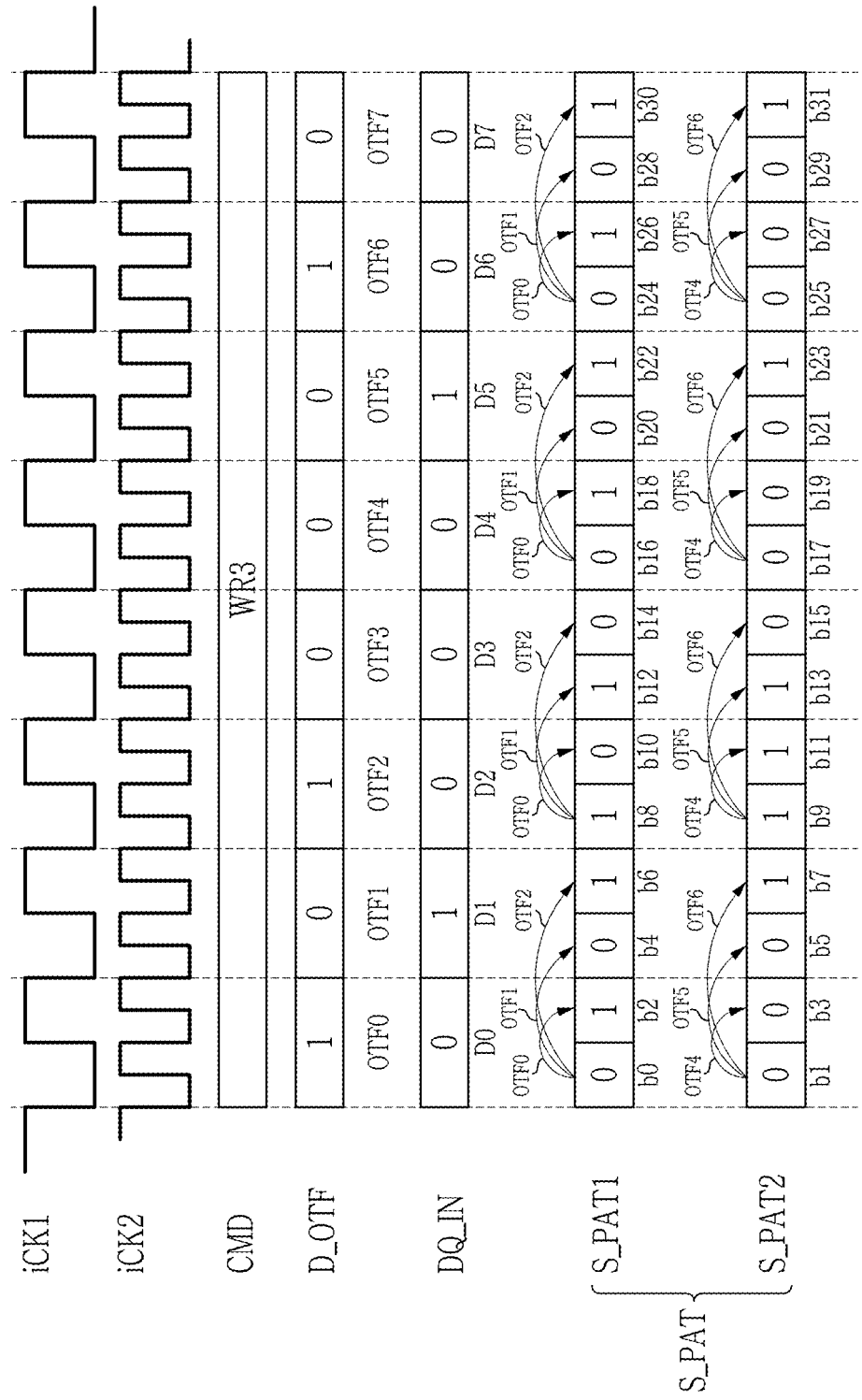
FIG. 10 illustrates an operation of a data pattern generator according to an embodiment.

FIG. 10 illustrating an operation of a data pattern generator according to an embodiment.

The description of the clock signals iCK1 and iCK2, the command CMD, the OTF data D_OTF, and the input data DQ_IN provided with reference to FIG. 8 may be applied to the clock signals iCK1 and iCK2, the command CMD, the OTF data D_OTF, and the input data DQ_IN shown in FIG. 10.

The first pattern signal S_PAT1 may be generated based on the first deserialized signal DES_1, and the second pattern signal S_PAT2 may be generated based on the second deserialized signal DES_2.

The data pattern generator 207 may be configured to generate the first pattern signal S_PAT1 by using the bit values OTF0, OTF1, and OTF2 of the OTF data D_OTF, and may be configured to generate the second pattern signal S_PAT2 by using the bit values OTF4, OTF5, and OTF6 of the OTF data D_OTF.

In detail, the data pattern generator 207 may be configured to determine the value of b2 based on the values of b0 and OTF0, may be configured to determine the value of b4 based on the values of b0 and OTF1, may be configured to determine the value of b6 based on the values of b0 and OTF2, may be configured to determine the value of b10 based on the values of b8 and OTF0, may be configured to determine the value of b12 based on the values of b8 and OTF1, may be configured to determine the value of b14 based on the values of b8 and OTF2, may be configured to determine the value of b18 based on the values of b16 and OTF0, may be configured to determine the value of b20 based on the values of b16 and OTF1, may be configured to determine the value of b22 based on the values of b16 and OTF2, may be configured to determine the value of b26 based on the values of b24 and OTF0, may be configured to determine the value of b28 based on the values of b24 and OTF1, and may be configured to determine the value of b30 based on the values of b24 and OTF2.

The data pattern generator 207 may be configured to determine the value of b3 based on the values of b1 and OTF4, may be configured to determine the value of b5 based on the values of b1 and OTF5, may be configured to determine the value of b7 based on the values of b1 and OTF6, may be configured to determine the value of b11 based on the values of b9 and OTF4, may be configured to determine the value of b13 based on the values of b9 and OTF5, and may be configured to determine the value of b15 based on the values of b9 and OTF6. The data pattern generator 207 may be configured to determine the value of b19 based on the values of b17 and OTF4, may be configured to determine the value of b21 based on the values of b17 and OTF5, may be configured to determine the value of b23 based on the values of b17 and OTF6, may be configured to determine the value of b27 based on the values of b25 and OTF4, may be configured to determine the value of b27 based on the values of b25 and OTF4, may be configured to determine the value of b29 based on the values of b25 and OTF5, and may be configured to determine the value of b31 based on the values of b25 and OTF6.

The first pattern signal S_PAT1 and the second pattern signal S_PAT2 may be output from the data pattern generator 207 using the clock signal iCK2.

An example of the pattern signal S_PAT generated by the data pattern generator 207 has been described with reference to FIG. 10. However, embodiments of the method for the data pattern generator to generate 32 bits of b0, b1, . . . , b31 are not limited thereto.

Figure 11:
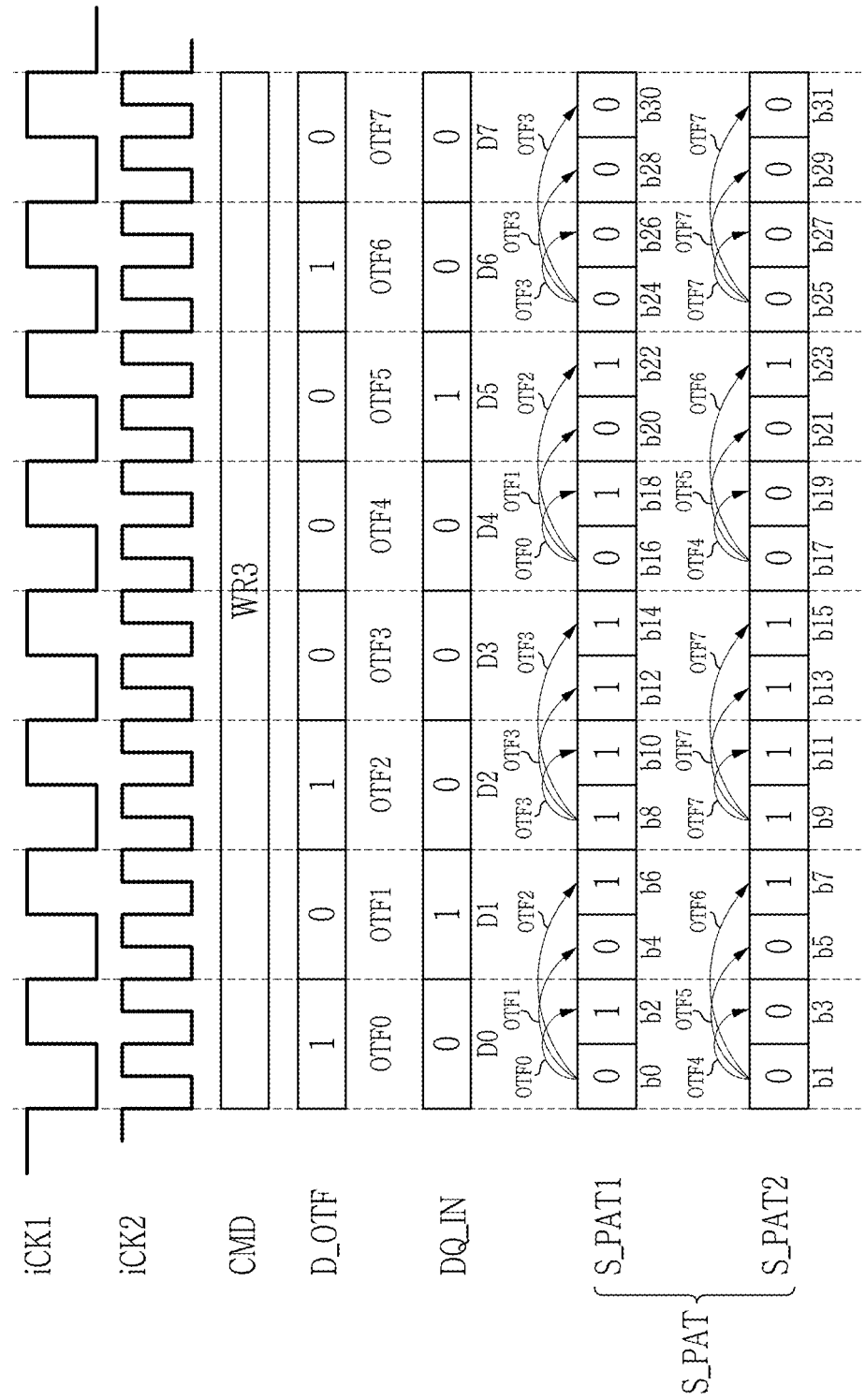
FIG. 11 illustrates an operation of a data pattern generator according to an embodiment.

FIG. 11 illustrates an operation of a data pattern generator according to an embodiment.

The description of the clock signals iCK1 and iCK2, the command CMD, the OTF data D_OTF, and the input data DQ_IN provided with reference to FIG. 8 may be applied to the clock signals iCK1 and iCK2, the command CMD, the OTF data D_OTF, and the input data DQ_IN shown in FIG. 11.

The first pattern signal S_PAT1 may be generated based on the first deserialized signal DES_1, and the second pattern signal S_PAT2 may be generated based on the second deserialized signal DES_2.

The data pattern generator 207 may be configured to generate the first pattern signal S_PAT1 by using the bit values OTF0, OTF1, OTF2, and OTF3 of the OTF data D_OTF, and may be configured to generate the second pattern signal S_PAT2 by using the bit values OTF4, OTF5, OTF6, and OTF7 of the OTF data D_OTF.

In detail, the data pattern generator 207 may be configured to determine the value of b2 based on the values of b0 and OTF0, may be configured to determine the value of b4 based on the values of b0 and OTF1, may be configured to determine the value of b6 based on the values of b0 and OTF2, may be configured to determine the values of b10, b12, and b14 based on the values of b8 and OTF3, may be configured to determine the value of b18 based on the values of b16 and OTF0, may be configured to determine the value of b20 based on the values of b16 and OTF1, may be configured to determine the value of b22 based on the values of b16 and OTF2, and may be configured to determine the values of b26, b28, and b30 based on the values of b24 and OTF3.

The data pattern generator 207 may be configured to determine the value of b3 based on the values of b1 and OTF4, may be configured to determine the value of b5 based on the values of b1 and OTF5, may be configured to determine the value of b7 based on the values of b1 and OTF6, may be configured to determine the values of b11, b13, and b15 based on the values of b9 and OTF7, may be configured to determine the value of b19 based on the values of b17 and OTF4, may be configured to determine the value of b19 based on the values of b17 and OTF5, may be configured to determine the value of b23 based on the values of b17 and OTF6, and may be configured to determine the values of b27, b29, and b31 based on the values of b25 and OTF7.

The first pattern signal S_PAT1 and the second pattern signal S_PAT2 may be output from the data pattern generator 207 using the clock signal iCK2.

An example of the pattern signal S_PAT generated by the data pattern generator 207 has been described with reference to FIG. 11. However, embodiments of the method for the data pattern generator to generate 32 bits of b0, b1, . . . , b31 are not limited thereto.

Figure 12:
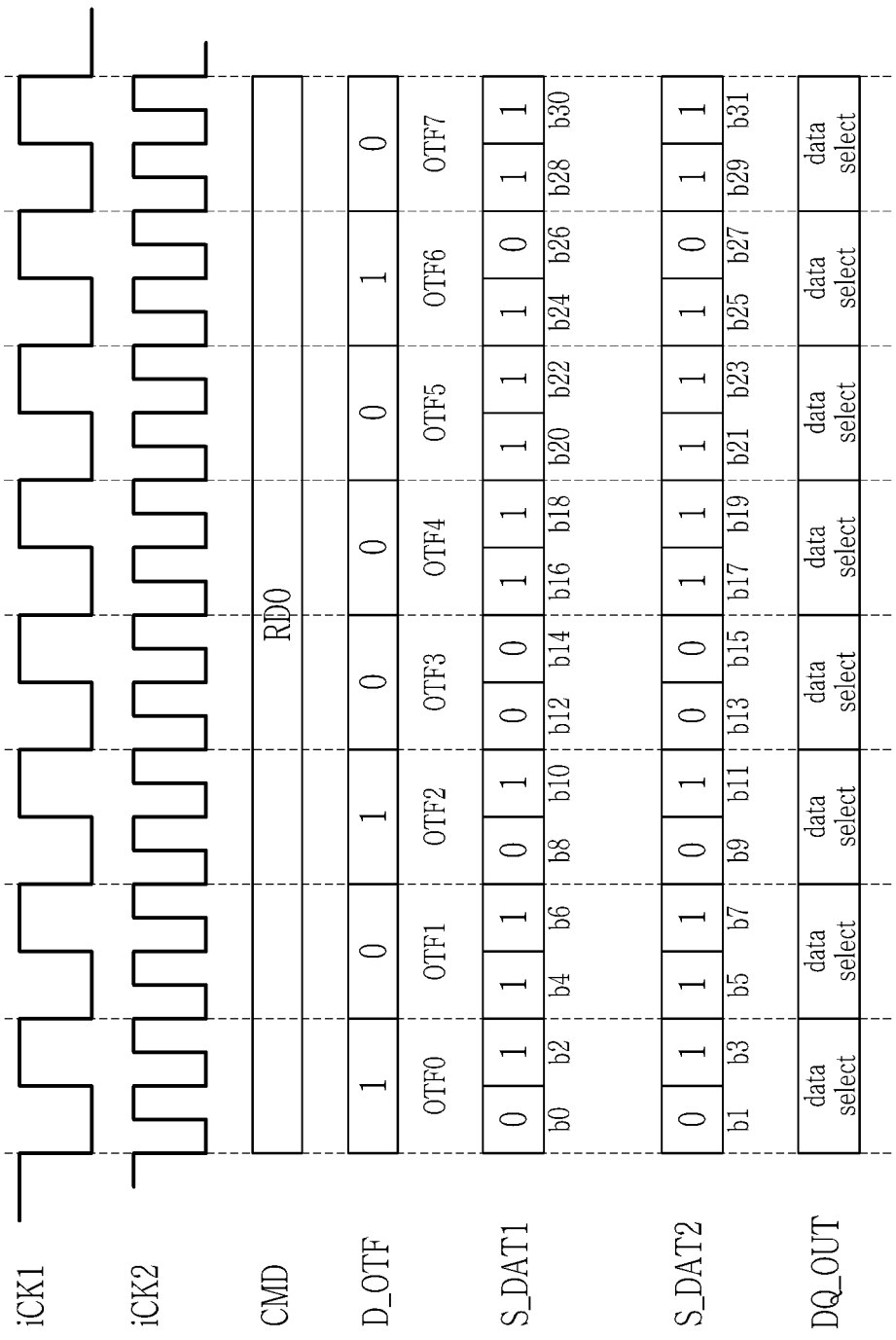
FIG. 12 illustrates outputs of a memory device according to an embodiment.

FIG. 12 illustrates outputs of a memory device according to an embodiment. In detail, FIG. 12 illustrates outputs of a memory device when the memory device is operated according to FIG. 6.

For better understanding and ease of description, the clock signals iCK1 and iCK2, the command CMD, the OTF data D_OTF, the pattern signals S_PAT1 and S_PAT2, and the output data DQ_OUT are shown as having the same timing in FIG. 12. However, in actuality, the memory device 20 may receive a command CMD from the test device 10, and the memory device 20 may output the output data DQ_OUT after a predetermined read latency.

The memory device 20 may be configured to generate the output data DQ_OUT based on the OTF data D_OTF and the pattern signal S_PAT. In detail, the serializer 215 may select two arbitrary OTF bits from among the 8-bit OTF data D_OTF, and may be configured to generate the output data DQ_OUT from the pattern signal S_PAT based on the value of the selected 2-bit OTF bit.

The memory device 20 may be configured to select one bit for each the first clock signal iCK1 in the pattern signal S_PAT. The serializer 215 may be configured to select eight bit values from among the 32-bit first pattern signal based on the value of two OTF bits. The selected eight bit data may be the (4n−3)-th (n is a natural number) bit. For example, when the OTF0 has the value of 0 and the OTF1 has the value of 1, the serializer 215 may select b1, b5, b9, . . . , b29 in the first pattern signal S_PAT1. The eighth selected bit data may be the (4m−4)-th (m is a natural number) bit. For example, when the OTF0 has the value of 0 and the OTF1 has the value of 0, the serializer 215 may be configured to select b0, b4, b8, . . . , b28 in the second pattern signal S_PAT2. The eighth selected bit data may be the (4o−2)-th (o is a natural number) bit. For example, when the OTF0 has the value of 1 and the OTF1 has the value of 0, the serializer 215 may be configured to select b2, b6, b10, . . . , b30 in the first pattern signal S_PAT1. The eighth selected bit data may be the (4p−1)-th (p is a natural number) bit. For example, when the OTF0 has the value of 1 and the OTF1 has the value of 1, the serializer 215 may be configured to select b3, b7, b11, . . . , b31 in the second pattern signal S_PAT2.

It has been described in FIG. 12 that the memory device 20 may be configured to select data in the first pattern signal S_PAT1 and the second pattern signal S_PAT2 by using the values of the OTF0 and the OTF1, however, embodiments of the present disclosure are not limited thereto, and the memory device 20 may be configured to select data by using two arbitrary values from among the eight bits of OTF0 to OTF7. The test device 10 may be configured to determine whether the input data DQ_IN is correctly written in the memory device 20 by changing the OTF data D_OTF. As described above, the test device 10 may be configured to compare the input data DQ_IN and the output data DQ_OUT based on the OTF data, and may determine whether the memory device 20 is operating normally.

Figure 13:
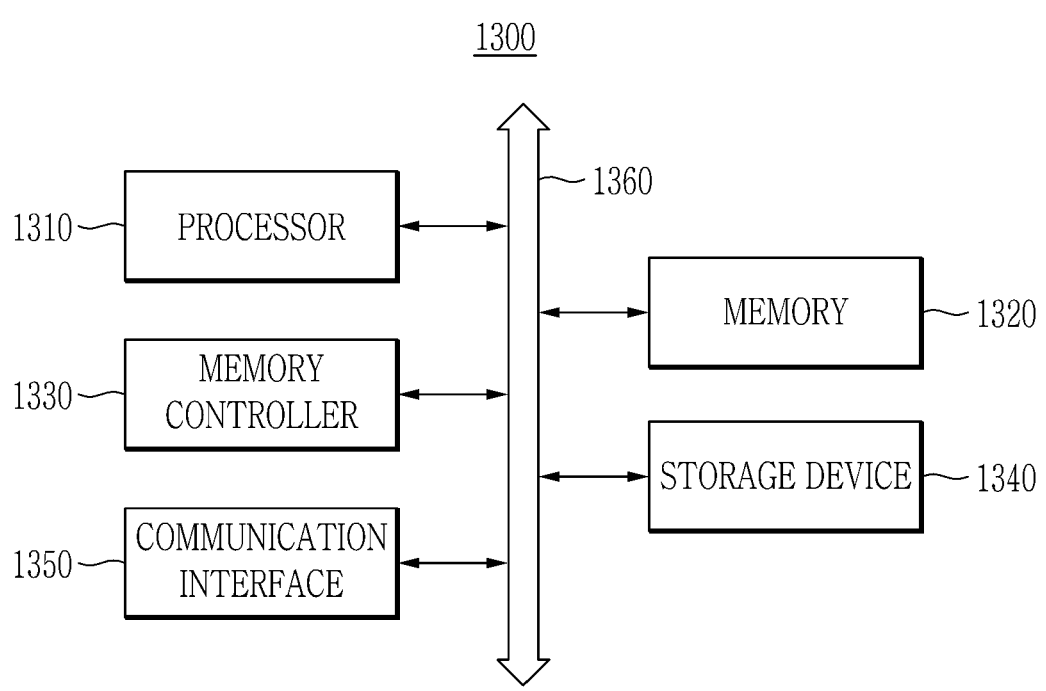
FIG. 13 is a block diagram of a computer system according to an embodiment.

FIG. 13 is a block diagram of a computer system according to an embodiment.

Referring to FIG. 13, the computing system 1300 includes a processor 1310, a memory 1320, a memory controller 1330, a storage device 1340, a communication interface 1350, and a bus 1360. The computing system 1300 may further include other general-purpose constituent elements.

The processor 1310 may be configured to control operation of the respective constituent elements of the computing system 1300. The processor 1310 may be realized with at least one of various types of processing units, such as a central processing unit (CPU), an application processor (AP), or a graphics processing unit (GPU).

The memory 1320 may be configured to store various types of data and instructions. The memory 1320 may be realized in the memory device described with reference to FIG. 1 to FIG. 12.

The memory controller 1330 may be configured to control transmission of data or instructions to/from the memory 1320. The memory controller 1330 may be realized with embodiments of the test device with reference to FIG. 1 to FIG. 12. The memory 1320 may be configured to receive a test signal from the memory controller 1330, and may be configured to output data corresponding to the received test signal. The memory controller 1330 may be configured to determine whether components in the memory 1320 are operating normally based on the data output by the memory 1320. The memory controller 1330 may be provided as an additional chip that is different from the processor 1310. The memory controller 1330 may be provided as an inner component of the processor 1310.

The storage device 1340 may be configured to non-temporarily store programs and data. The storage device 1340 may be realized as a non-volatile memory. The communication interface 1350 may support wired and wireless network communication of the computing system 1300. The communication interface 1350 may support various types of communication methods in addition to the network communication methods. The bus 1360 may provide communication functions among the constituent elements of the computing system 1300. The bus 1360 may include at least one type of bus according to a communication protocol among the constituent elements.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A memory device comprising:
   a memory cell array;
   a timing circuit configured to generate a first clock signal and a second clock signal, the second clock signal having a frequency that is i-times the frequency of the first clock signal;
   a command decoder configured to receive On-The-Fly (OTF) data including a plurality of OTF bits;
   a receiver configured to receive input data, configured to sample the input data based on the first clock signal, and configured to generate a first signal based on the sampled input data;
   a deserializer configured to generate a first deserialized signal from the first signal based on the second clock signal;
   a data pattern generator configured to generate a pattern signal based on the first deserialized signal and the OTF data based on the second clock signal; and
   a decoder configured to transmit the pattern signal to the memory cell array,
   wherein i is a natural number greater than or equal to 2.

2. The memory device of claim 1,
   wherein the first signal has n-bit data, and the first deserialized signal has 2n-bit data.

3. The memory device of claim 2,
   wherein the deserializer comprises a plurality of samplers configured to parallelize n-bit data of the first signal and configured to generate the first deserialized signal.

4. The memory device of claim 2, wherein the data pattern generator comprises
   a combination logic configured to generate an inverted data signal with 2n-bit data based on the OTF data, and
   a plurality of XOR gates configured to perform an XOR operation on respective bits of the inverted data signal and respective bits of the first deserialized signal and configured to generate the pattern signal having 2n-bit data.

5. The memory device of claim 4,
   wherein each of the plurality of OTF bits are sequentially arranged in the inverted data signal.

6. The memory device of claim 4,
   wherein the receiver is further configured to sample the input data based on the first clock signal to generate a second signal with n-bit data,
   wherein the deserializer is further configured to insert new bits among n-bit data of the second signal based on the second clock signal to generate a second deserialized signal,
   wherein the data pattern generator is further configured to generate the pattern signal based on the second deserialized signal based on the second clock signal,
   wherein at least some of the plurality of XOR gates are configured to perform an XOR operation on respective bits of the inverted data signal and respective bits of the second deserialized signal, and
   wherein the inverted data signal comprises a first inverted data signal on which an XOR operation is performed with the first deserialized signal and a second inverted data signal on which an XOR operation is performed with the second deserialized signal.

7. The memory device of claim 6,
   wherein the first inverted data signal is equivalent to the second inverted data signal.

8. The memory device of claim 6,
   wherein the first inverted data signal is different from the second inverted data signal.

9. The memory device of claim 1, further comprising
   a data input and output controller configured to generate a first control signal for controlling the deserializer and configured to generate a second control signal for controlling the data pattern generator,
   wherein the deserializer is further configured to parallelize the first signal according to the first control signal to generate the deserialized signal, and
   wherein the data pattern generator is further configured to determine OTF bits that correspond to respective bits in the deserialized signal from among the plurality of OTF bits according to the second control signal, to generate new bits based on the corresponding OTF bits, and to arrange the deserialized signal and the new bits to generate the pattern signal.

10. The memory device of claim 9,
    wherein the data input and output controller is further configured to generate a third control signal for controlling the decoder, the decoder comprises a decoding portion for generating a decoding signal by decoding the pattern signal and a delay portion for generating a first delay signal by delaying the pattern signal, and the decoder is configured to transmit the decoding signal or the first delay signal to the memory cell array according to the third control signal.

11. The memory device of claim 9, further comprising
    an encoder comprising an encoding portion configured to generate an encoding signal by encoding output data output by the memory cell array and a delay portion configured to generate a second delay signal by delaying the output data,
    wherein the data input and output controller is further configured to generate a fourth control signal for controlling the encoder, and the encoder is configured to output the encoding signal or the second delay signal as a data signal according to the fourth control signal.

12. The memory device of claim 11, further comprising
a serializer configured to generate a first serialized signal based on the data signal, wherein the first serialized signal has n-bit data.

13. The memory device of claim 12,
wherein the serializer is further configured to select n bits from among the output data based on the plurality of OTF bits, and is configured to generate the first serialized signal based on the selected n bits.

14. The memory device of claim 1,
wherein the first signal has n-bit data and the first deserialized signal has 4n-bit data.

15. The memory device of claim 1,
wherein the command decoder is further configured to receive the OTF data through one of an ERR terminal, a command terminal, and an address terminal.

16. A test method comprising:
receiving input data and On-The-Fly (OTF) data comprising a plurality of OTF bits;
sampling the input data based on first clock signal to generate a first signal based on the sampled input data;
generating a first deserialized signal from the first signal based on a second clock signal having a frequency that is i-times the frequency of the first clock signal;
generating a pattern signal based on the first deserialized signal and the OTF data based on the second clock signal, and storing the pattern signal in a memory cell array; and
sequentially arranging respective bits in output data output by the memory cell array and generating a first serialized signal based on the output data,
wherein i is a natural number greater than or equal to 2.

17. The test method of claim 16, further comprising
comparing the input data and the first serialized signal and determining whether the memory device operated normally.

18. A test system, comprising:
a memory device; and
a test device for testing the memory device,
wherein the test device is configured to transmit a write command, On-The-Fly (OTF) data comprising a plurality of OTF bits, and input data to the memory device, is configured to transmit a read command and the OTF data to the memory device, is configured to receive output data from the memory device, and is configured to compare the input data and the output data, and
wherein the memory device is configured to receive the write command, is configured to sample the input data based on a first clock signal to generate a first signal, is configured to generate a first deserialized signal from the first signal based on a second clock signal having a frequency that is i-times the frequency of the first clock signal, is configured to generate a pattern signal based on the first deserialized signal and the OTF data based on the second clock signal, is configured to store the pattern signal in a memory cell array, is configure to receive the read command, is configured to select some bits of the pattern signal based on the OTF data, is configured to arrange the some bits, and is configured to output the output data including the some bits,
wherein i is a natural number greater than or equal to 2.

19. The test system of claim 18,
wherein the first signal has n-bit data, and the first deserialized signal has 4n-bit data.

20. The test system of claim 18,
wherein the first signal has n-bit data, and the first deserialized signal has 2n-bit data, and
the memory device is configured to generate an inverted data signal having the 2n-bit data based on the OTF data, and is configured to perform an XOR operation on respective bits of the inverted data signal and respective bits of the first deserialized signal to generate the pattern signal.

* * * * *